United States Patent
Iwami

(10) Patent No.: US 9,832,862 B2
(45) Date of Patent: Nov. 28, 2017

(54) CONDUCTIVE FILM, DISPLAY DEVICE PROVIDED WITH SAME, AND METHOD FOR EVALUATING CONDUCTIVE FILM

(71) Applicant: FUJIFILM Corporation, Tokyo (JP)

(72) Inventor: Kazuchika Iwami, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 189 days.

(21) Appl. No.: 14/817,197

(22) Filed: Aug. 3, 2015

(65) Prior Publication Data

US 2015/0342034 A1 Nov. 26, 2015

Related U.S. Application Data

(63) Continuation of application No. PCT/JP2014/051525, filed on Jan. 24, 2014.

(30) Foreign Application Priority Data

Feb. 5, 2013 (JP) ................................. 2013-020775
Jul. 31, 2013 (JP) ................................. 2013-159113

(51) Int. Cl.
*G06F 3/045* (2006.01)
*H05K 1/02* (2006.01)
(Continued)

(52) U.S. Cl.
CPC ............. *H05K 1/0274* (2013.01); *G01J 3/42* (2013.01); *G06F 1/16* (2013.01); *G06F 3/044* (2013.01);
(Continued)

(58) Field of Classification Search
CPC ...... G06F 3/041; G06F 3/0412; G06F 3/0416; G06F 3/044; G06F 3/047;
(Continued)

(56) References Cited

U.S. PATENT DOCUMENTS 9,483,149 B2* 11/2016 Iwami ..................... G06F 3/044
2014/0098307 A1* 4/2014 Iwami ..................... B32B 15/02
349/12

(Continued)

FOREIGN PATENT DOCUMENTS

JP 2001174780 6/2001
JP 2008025025 2/2008
(Continued)

OTHER PUBLICATIONS

"International Preliminary Report on Patentability" of PCT/JP2014/051525, dated Aug. 11, 2015, p. 1-p. 8.
(Continued)

*Primary Examiner* — Joe H Cheng
(74) *Attorney, Agent, or Firm* — JCIPRNET

(57) ABSTRACT

The conductive film includes a transparent substrate and a conductive portion having a wiring pattern, in which when the wiring pattern is observed from at least one visual point, with respect to frequencies and intensities of moires which are calculated respectively from peak frequencies and peak intensities of predetermined data and peak frequencies and peak intensities of another predetermined data, an evaluation index of moire, which is calculated from evaluation values of moires obtained by applying visual response characteristics of a human being to the intensities of the moires according to an observation distance at the frequencies of the respective moires that are equal to or lower than the maximum frequency of moire specified according to display resolution of the display unit, is equal to or less than a predetermined value.

16 Claims, 10 Drawing Sheets

(51) Int. Cl.
*G06F 3/041* (2006.01)
*G06F 1/16* (2006.01)
*G01J 3/42* (2006.01)
*G06F 3/044* (2006.01)
*H05K 9/00* (2006.01)

(52) U.S. Cl.
CPC ......... *G06F 3/0412* (2013.01); *H05K 1/0296* (2013.01); *H05K 9/0096* (2013.01); *G06F 2203/04112* (2013.01)

(58) Field of Classification Search
CPC ........ G06F 2203/04112; H05K 1/0296; H05K 2201/09681
See application file for complete search history.

(56) References Cited

U.S. PATENT DOCUMENTS

| | | | |
|---|---|---|---|
| 2014/0102342 A1* | 4/2014 | Maryamchik | F22B 31/0038 110/245 |
| 2015/0015979 A1* | 1/2015 | Iwami | H05K 9/0096 359/893 |
| 2015/0015980 A1* | 1/2015 | Iwami | H05K 9/0096 359/893 |
| 2015/0286323 A1* | 10/2015 | Iwami | G06F 3/041 345/174 |
| 2016/0092012 A1* | 3/2016 | Yamaguchi | G06F 1/16 345/173 |
| 2016/0170541 A1* | 6/2016 | Iwami | G06F 3/044 345/174 |
| 2017/0052643 A1* | 2/2017 | Iwami | G09F 9/00 |

FOREIGN PATENT DOCUMENTS

| | | |
|---|---|---|
| JP | 2009-117683 | 5/2009 |
| JP | 2011-216379 | 10/2011 |

OTHER PUBLICATIONS

"Office Action of Japan Counterpart Application" with partial English translation, dated Jun. 7, 2016, p. 1-p. 6.
"Office Action of Japan Counterpart Application", dated Feb. 7, 2017, with English translation thereof, p. 1-p. 4.
"Office Action of Taiwan Counterpart Application," with partial English translation thereof, dated Jul. 20, 2017, pp.1-19.
"Office Action of Japan Counterpart Application," with machine English translation thereof, dated Sep. 26, 2017, pp1-6.

* cited by examiner

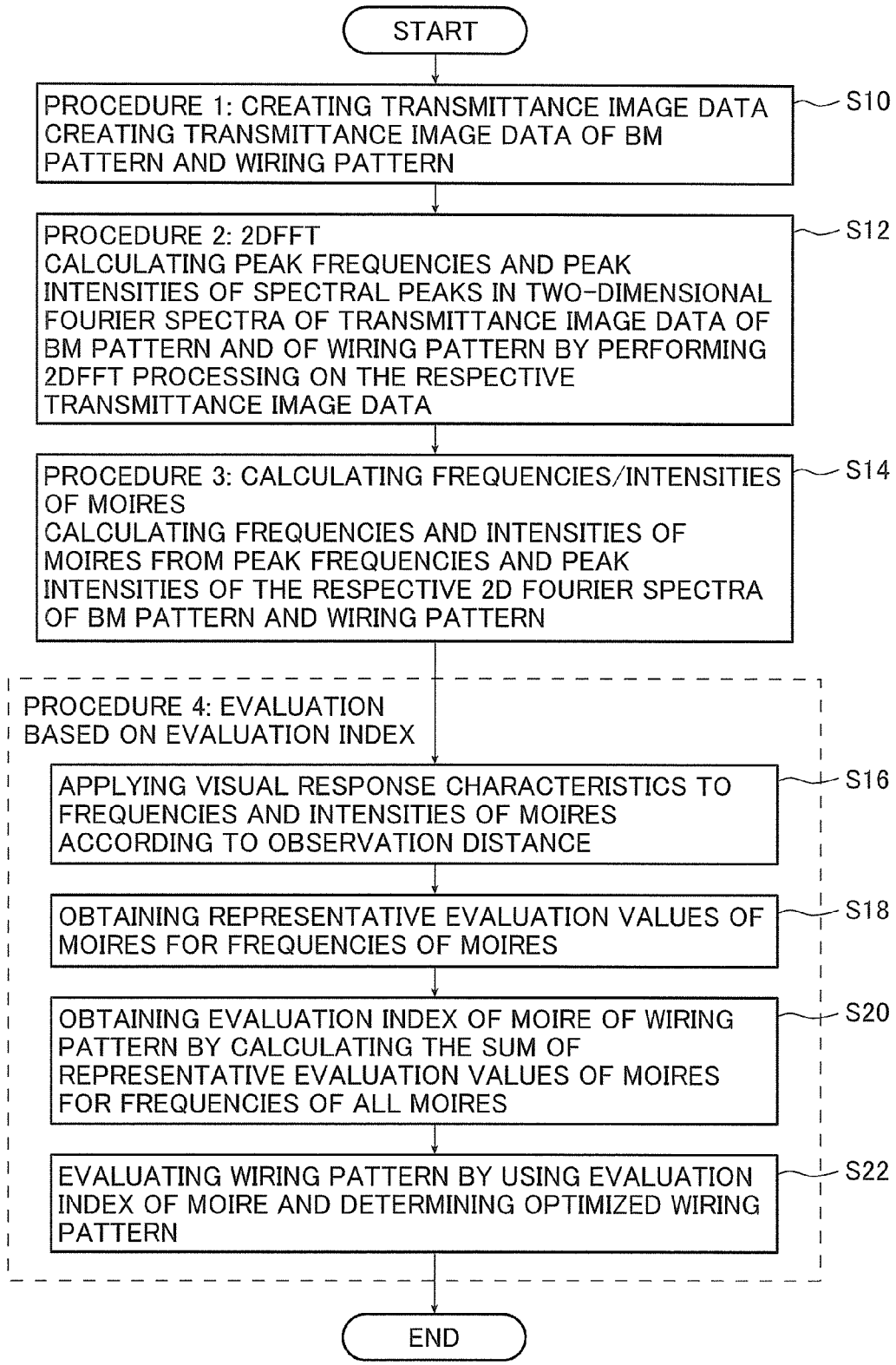

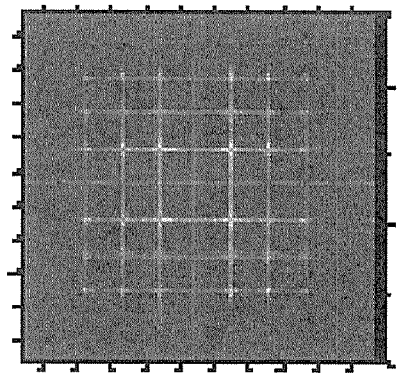
FIG. 9A
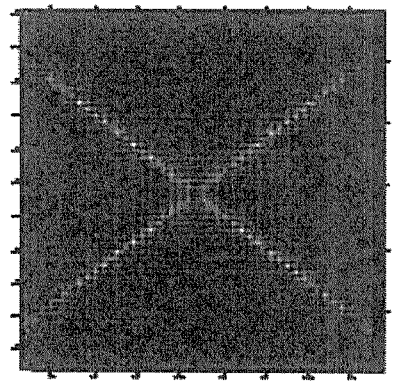
FIG. 9B
FIG. 10
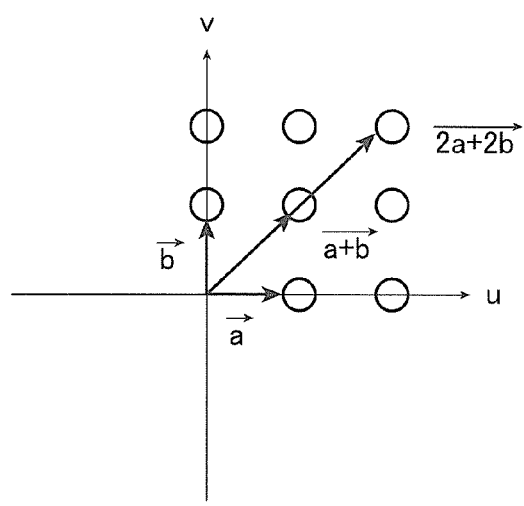
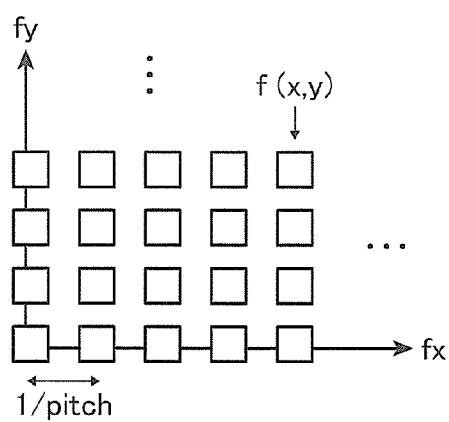
FIG. 11A
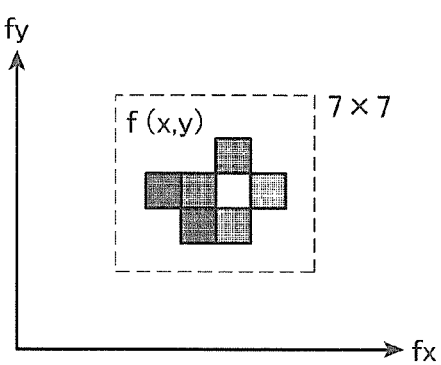
FIG. 11B

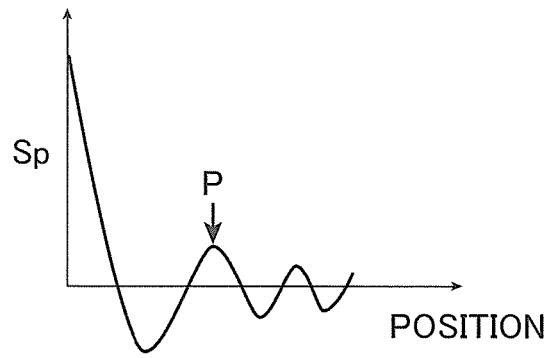
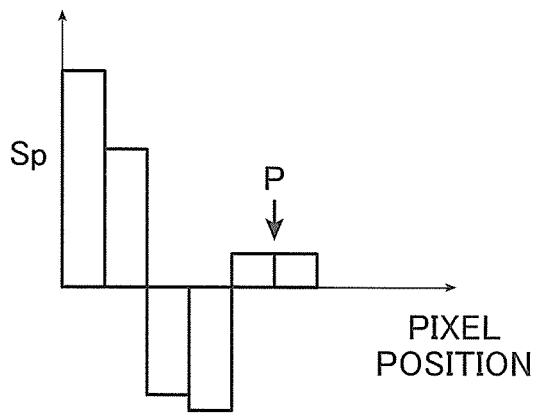
FIG. 12A    FIG. 12B
FIG. 13
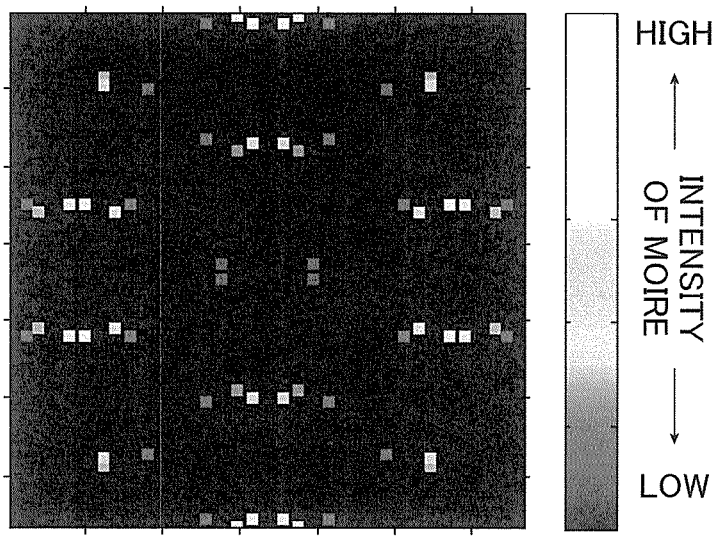

FIG. 17
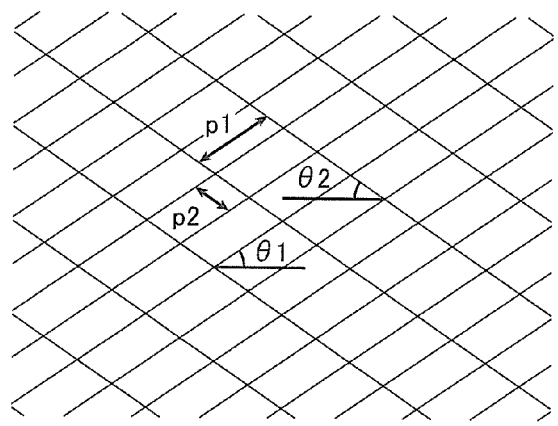
FIG. 18A
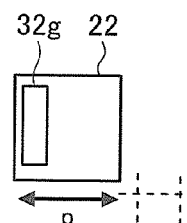
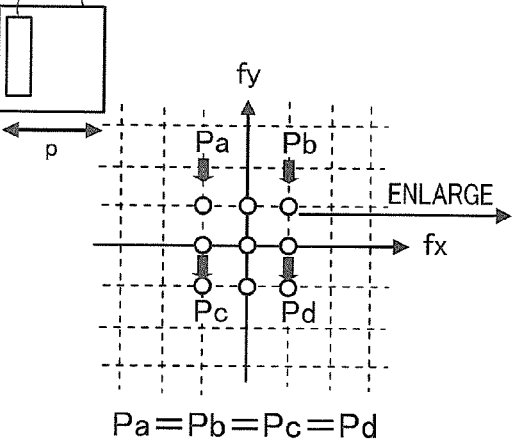
Pa=Pb=Pc=Pd
FIG. 18B
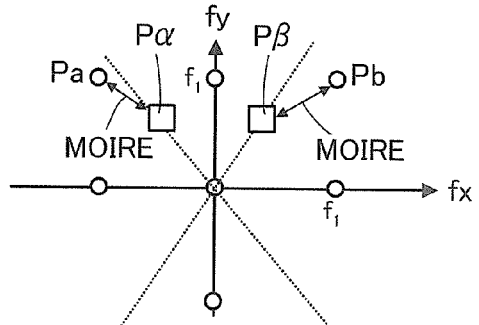
FIG. 18C FIG. 19A
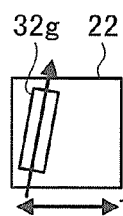
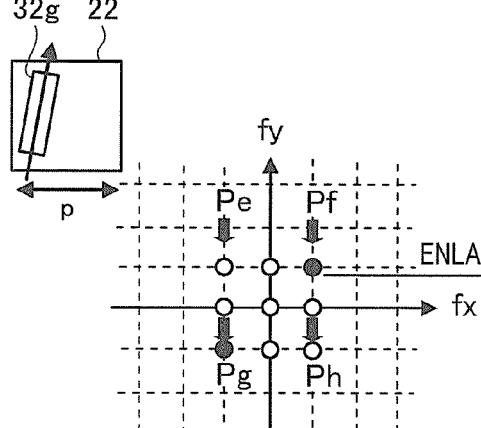
Pe=Ph, Pf=Pg, Pe≠Pf
FIG. 19B
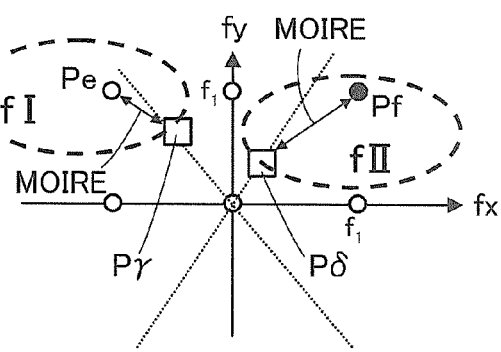
FIG. 19C

CONDUCTIVE FILM, DISPLAY DEVICE PROVIDED WITH SAME, AND METHOD FOR EVALUATING CONDUCTIVE FILM

CROSS-REFERENCE TO RELATED APPLICATIONS

This application is a Continuation of PCT International Application No. PCT/JP2014/051525 filed on Jan. 24, 2014, which claims priority under 35 U.S.C. §119(a) to Japanese Patent Application No. 2013-020775 filed on Feb. 5, 2013 and Japanese Patent Application No. 2013-159113 filed on Jul. 31, 2013. Each of the above application(s) is hereby expressly incorporated by reference, in its entirety, into the present application.

BACKGROUND OF THE INVENTION

The present invention relates to a conductive film having a mesh-like wiring pattern (hereinafter, also referred to as a mesh pattern) in which the frequency/intensity of visually recognized moire is caused to be within a predetermined range of frequency/intensity by designing a mesh pattern of a mesh-like transparent conductive film in consideration of conductive wiring of an electrode or the like. The present invention also relates to a display device provided with the conductive film and a method for evaluating a conductive film. In the present invention, "moire recognition property" and "electrode recognition property" respectively refer to invisibleness of moire and invisibleness of an electrode, or difficulty to visually recognize moire and difficulty to visually recognize an electrode, and "improvement in moire recognition property" and "improvement in electrode recognition property" respectively refer to a state where moire becomes less visible or becomes invisible and a state where an electrode becomes less visible or becomes invisible.

Examples of a conductive film installed on a display unit of a display device (hereinafter, also referred to as a display) include a conductive film for electromagnetic wave-shielding and a conductive film for a touch panel (for example, see Patent Literatures 1 and 2).

JP 2009-117683 A filed by the applicant of the present application discloses that a second pattern, which is generated from second pattern data in which the relative distance between spectrum peaks of two-dimensional Fourier spectrums (2DFFT Sp) of the respective pattern data of a first pattern such as a pixel array pattern (for example, a black matrix (hereinafter, also referred to as BM) pattern) of a display and the second pattern such as an electromagnetic wave-shielding pattern is greater than a predetermined spatial frequency, for example, 8 cm$^{-1}$, is automatically selected.

JP 2009-117683 A also discloses that when the relative distance is not greater than the predetermined spatial frequency, changing of one or more of a rotation angle, a pitch, and a pattern width of the second pattern data to generate new second pattern data is repeated until the relative distance is greater than the predetermined spatial frequency.

In this way, in JP 2009-117683 A, it is possible to automatically select an electromagnetic wave-shielding pattern that can suppress the occurrence of moire and that can avoid an increase in surface resistivity or degradation in transparency.

Meanwhile, JP 2011-216379 A filed by the applicant of the present application discloses, as a transparent conductive film having a mesh pattern composed of a plurality of polygonal meshes, a transparent conductive film in which a mesh pattern is formed such that with respect to the centroid spectrum of each mesh, an average intensity on the side of a higher spatial frequency band than a predetermined spatial frequency, for example, a spatial frequency in which visual response characteristics of a human being correspond to 5% of maximum response, is larger than an average intensity on the side of a lower spatial frequency band than the predetermined spatial frequency.

JP 2011-216379 A describes that by the above constitution, it is possible to provide a transparent conductive film which can reduce granular feeling of noise resulting from the pattern, greatly improve visibility of an object to be observed, and have a stable electrical conductivity even after being cut.

SUMMARY OF THE INVENTION

JP 2009-117683 A discloses the technique of controlling a moire frequency using only frequency information of a black matrix (BM) pattern/a wiring pattern of a display in generating a wiring pattern of the conductive film and providing a wiring pattern having excellent visibility, but the determination of whether moire is visually recognized or not depends on only the frequency. Since human perception of moire is affected by intensity as well as frequency, even at a frequency at which moire is not visually recognized in the technique of JP 2009-117683 A, moire may be visually recognized depending on the intensity, and thus there is a problem in that the moire recognition property is not improved satisfactorily. Particularly, when the technique disclosed in JP 2009-117683 A is applied to a conductive film for a touch panel, since the conductive film is pressed with a human finger, a minute distortion occurs between the BM/wiring patterns, and thus there is a problem in that visual recognition of moire due to intensity is promoted. Accordingly, when the technique disclosed in JP 2009-117683 A is applied to a conductive film for a touch panel, there is a problem in that the improvement in the moire recognition property is not satisfactory.

In JP 2011-216379 A, with respect to the centroid spectrum of each mesh of the mesh pattern of the transparent conductive film, the average intensity in a middle to high spatial frequency band higher than a predetermined spatial frequency in which the visual response characteristics of a human being are drastically decreased is made larger than the average intensity in a low spatial frequency band in which the visual response characteristics of a human being are high, and in this way, the feeling of noise visually recognized by a human being is reduced. However, JP 2011-216379 A has a problem in that it merely focuses on the reduction of the feeling of noise resulting from the mesh pattern of the transparent conductive film, and does not present a method for improving the moire recognition property by inhibiting moire that occurs between a BM pattern of a display and the mesh pattern of the transparent conductive film.

An object of the present invention is to solve the aforementioned problems of the conventional technique and to provide a conductive film, which makes it possible to inhibit the occurrence of moire and to greatly improve the visibility of a display screen (hereinafter, also referred to as "display surface") of a display unit in any of display devices having different resolution and regardless of an observation distance, a display device provided with the conductive film, and a method for evaluating a conductive film.

Particularly, in a case in which a transparent conductive film having wiring is used as an electrode for a touch panel, if the conductive film is superimposed on a black matrix of a display unit of a display device and visually recognized, the occurrence of moire greatly impairs image quality. Therefore, another object of the present invention is to provide a conductive film, which makes it possible to inhibit the occurrence of moire in such a case and to greatly improve the visibility of display on a touch panel in any of display devices having different resolution and regardless of an observation distance, a display device provided with the conductive film, and a method for evaluating a conductive film.

In addition to the aforementioned objects, another object of the present invention is to provide a conductive film, which makes it possible to inhibit the occurrence of moire in both a case in which the conductive film is visually recognized by being superimposed on a symmetrical black matrix of a display unit of a display device and a case in which the conductive film is visually recognized by being superimposed on an asymmetrical black matrix of a display unit of a display device and to greatly improve visibility of display on a touch panel, a display device provided with the conductive film, and a method for evaluating a conductive film.

As a technique for achieving the aforementioned objects, Japanese Patent Application No. 2012-082711 filed by the applicant of the present application suggests a conductive film having a wiring pattern in which an evaluation value, which is calculated by convolution of a two-dimensional frequency spectrum and an intensity of moire, which have been obtained as a difference between spatial frequency peaks of a pixel matrix of a display and a mesh pattern and an integrated value of the intensities of the spatial frequency peaks, and a visual transfer function, satisfies a predetermined value.

However, in order to further improve the technique for achieving the aforementioned objects, the present applicant further repeated intensive research. As a result, the present applicant obtained knowledge that, in reality, the spatial frequency band of the moire visually recognized on a display varies with the display, but the aforementioned technique did not take account of this point. Moreover, the present applicant obtained knowledge that if moire within a certain evaluation value cannot be defined without depending on display resolution (from about 90 dpi to about 500 dpi), it is difficult to universally improve the moire recognition property with respect to resolution. In other words, the present applicant obtained knowledge that the aforementioned technique has a problem in that the technique should be advantageous for a display with high resolution (the technique should make moire occur at a high frequency), but it is not always the case in reality.

As a result, based on the aforementioned knowledge, the present applicant found that the problems of the technique result from the evaluation value used, and accomplished the present invention.

In order to attain the above-described objects, a conductive film according to a first embodiment of the present invention installed on a display unit of a display device comprises: a transparent substrate; and a conductive portion which is formed on at least one surface of the transparent substrate and is composed of a plurality of thin metal wires, wherein the conductive portion has a wiring pattern which is formed of the plurality of thin metal wires in a form of a mesh and in which a plurality of openings are arranged, wherein the wiring pattern is superimposed on a pixel array pattern of the display unit, and wherein when the wiring pattern is observed from at least one visual point, with respect to frequencies and intensities of moires which are calculated respectively from peak frequencies and peak intensities of a plurality of spectral peaks of two-dimensional Fourier spectra of transmittance image data of the wiring pattern and peak frequencies and peak intensities of a plurality of spectral peaks of two-dimensional Fourier spectra of transmittance image data of the pixel array pattern, an evaluation index of moire, which is calculated from evaluation values of moires obtained by applying visual response characteristics of a human being to the intensities of the moires according to an observation distance at the frequencies of the respective moires that are equal to or lower than the maximum frequency of moire specified according to display resolution of the display unit, is equal to or less than a predetermined value.

In order to attain the above-described objects, a display device according to a second embodiment of the present invention comprises: a display unit; and the conductive film according to the first embodiment that is installed on the display unit.

Furthermore, in order to attain the above-described objects, a method according to a third embodiment of the present invention for evaluating a conductive film that is installed on a display unit of a display device and has a wiring pattern which is formed of a plurality of thin metal wires in a form of a mesh and in which a plurality of openings are arranged comprises steps of: obtaining transmittance image data of the wiring pattern and transmittance image data of a pixel array pattern of the display unit on which the wiring pattern is superimposed; calculating peak frequencies and peak intensities of a plurality of spectral peaks of two-dimensional Fourier spectra of the transmittance image data of the wiring pattern and calculating peak frequencies and peak intensities of a plurality of spectral peaks of two-dimensional Fourier spectra of the transmittance image data of the pixel array pattern by performing two-dimensional Fourier transform on the transmittance image data of the wiring pattern and the transmittance image data of the pixel array pattern; calculating frequencies and intensities of moires from the peak frequencies and peak intensities of the wiring pattern calculated as above and the peak frequencies and peak intensities of the pixel array pattern calculated as above; selecting moire having a frequency equal to or lower than the maximum frequency of moire specified according to display resolution of the display unit, from among the moires having the frequencies and the intensities calculated as above; obtaining evaluation values of moires by applying visual response characteristics of a human being to the intensities of moires according to an observation distance at the frequencies of the respective moires selected as above; calculating an evaluation index of moire from a plurality of the evaluation values of moires obtained as above; and evaluating a conductive film in which the evaluation index of moire calculated as above is equal to or less than a predetermined value.

In the first, second and third embodiments, the predetermined value is −1.75, and the evaluation index is preferably equal to or less than −1.75, more preferably equal to or less than −1.89, yet more preferably equal to or less than −2.05, and most preferably equal to or less than −2.28 expressed in terms of a common logarithm.

Preferably, provided that a display pitch of the display unit is p (μm), the maximum frequency of the moire is $1,000/(2p)$.

Preferably, the evaluation values of moires are obtained by performing weighting on the frequencies and intensities of moires by convolution integral using a visual transfer function according to the observation distance as the visual response characteristics.

And, preferably, the visual transfer function is a visual sensitivity function S(u) determined by the following Equation (1),

[Mathematical Formula 1]

$$S(u) = \frac{5200 e^{-0.0016 u^2 (1+100/L)^{0.08}}}{\sqrt{\left(1 + \frac{144}{X_o^2} + 0.64 u^2\right)\left(\frac{63}{L^{0.83}} + \frac{1}{1 - e^{-0.02 u^2}}\right)}} \quad (1)$$

wherein u represents a spatial frequency (cycle/deg); L represents brightness (cd/mm$^2$); $X_0$ represents a viewing angle (deg) of a display surface of the display unit at the observation distance; and $X_0^2$ represents a solid angle (sr) formed by the display surface at the observation distance.

Preferably, the evaluation index of moire is calculated for a single frequency of the moire by using the worst evaluation value among the plurality of evaluation values of moires having undergone weighting according to the observation distance, and preferably, the evaluation index of moire is a sum obtained by summing up the worst evaluation values, each of which is selected for the single frequency of the moire, for all of the frequencies of the moires.

Preferably, the frequencies of moires are obtained as a difference between the peak frequencies of the wiring pattern and the peak frequencies of the pixel array pattern, and the intensities of moires are obtained as a product of the peak intensities of the wiring pattern and the peak intensities of the pixel array pattern.

Preferably, moire selected to apply the visual response characteristics has the intensity of moire of equal to or higher than −4 and has a frequency equal to or lower than the maximum frequency.

Preferably, the peak intensity is a sum of intensities in a plurality of pixels in a vicinity of a peak position of each of the plurality of spectral peaks, and preferably, the peak intensities are a sum of intensities of top 5 pixels ranked high in terms of intensity among 7×7 pixels in a vicinity of the peak position.

Preferably, the peak intensities are standardized by using the transmittance image data of the wiring pattern and the pixel array pattern.

Preferably, the pixel array pattern is the black matrix pattern.

Preferably, when peak intensity distribution of the plurality of spectral peaks of the two-dimensional Fourier spectra of the pixel array pattern is symmetrical, the wiring pattern has a symmetrical pattern shape.

Preferably, when peak intensity distribution of the plurality of spectral peaks of the two-dimensional Fourier spectra of the pixel array pattern is asymmetrical, the wiring pattern has an asymmetrical pattern shape.

As described above, according to the present invention, it is possible to inhibit the occurrence of moire and to greatly improve visibility.

Particularly, according to the present invention, the evaluation value of moire that is not visually recognized is calculated in consideration of resolution of a display device such as a display. Therefore, it is possible to generally improve the moire recognition property for display devices having different resolution. Furthermore, according to the present invention, an evaluation function depending on an observation distance is set. Therefore, it is possible to evaluate the moire recognition property by using a highly accurate evaluation index, to rank moires, and to greatly improve visibility regardless of the observation distance.

That is, in the present invention, the frequencies/intensities of moires obtained by frequency analysis of a pixel array pattern of a display device and a wiring pattern of a conductive film are calculated, and values of the calculated frequencies/intensities of moires are limited in consideration of the resolution of the display device and the observation distance such that the visibility becomes excellent. Consequently, it is possible to prevent image quality from being impaired due to the occurrence of moire and to obtain excellent visibility regardless of the resolution of the display device and the observation distance.

Particularly, in a case in which a conductive film is used as an electrode for a touch panel, if the conductive film is superimposed on a black matrix of a display unit of a display device and observed, the moire greatly impairs image quality. According to the present invention, it is possible to inhibit the moire in this case regardless of the resolution of the display device and the observation distance and to greatly improve the visibility of display on the touch panel.

BRIEF DESCRIPTION OF THE DRAWINGS

FIG. 6 is a flowchart showing an example of a method for evaluating wiring of the conductive film according to the present invention.

FIG. 9A is a view showing intensity characteristics of two-dimensional Fourier spectra of transmittance image data of the pixel array pattern shown in FIG. 7A, and FIG. 9B is a view showing intensity characteristics of two-dimensional Fourier spectra of transmittance image data of the wiring pattern shown in FIG. 7B.

FIG. 10 is a graph showing positions of frequency peaks of the pixel array pattern of the display unit shown in FIG. 7A.

FIG. 11A is a graph illustrating positions of frequency peaks of an input pattern image, and FIG. 11B is a graph illustrating how to calculate peak intensities of the positions of frequency peaks.

FIG. 12A is a graph in which an example of intensity characteristics of two-dimensional Fourier spectra is shown in the form of a curve, and FIG. 12B is a bar graph in which an example of intensity characteristics of two-dimensional Fourier spectra is shown in the form of a bar.

FIG. 13 is a view schematically illustrating the frequencies and intensities of moires that occur due to the interference between the pixel array pattern shown in FIG. 7A and the wiring pattern shown in FIG. 7B.

FIG. 17 is a plan view schematically showing another example of the wiring pattern of the conductive film of the present invention.

FIG. 18A is a view schematically illustrating an example of a pixel array pattern of a display unit to which the conductive film according to the present invention is applied; FIG. 18B is a graph illustrating positions of frequency peaks of an image of the pixel array pattern of FIG. 18A; and FIG. 18C is a view obtained by enlarging the graph of FIG. 18B, in which exemplary frequency peaks of a mesh pattern of the conductive film to be superimposed on the pixel array pattern of FIG. 18A are superimposed on the pixel array pattern.

FIG. 19A is a view schematically illustrating another example of a pixel array pattern of a display unit to which the conductive film according to the present invention is applied; FIG. 19B is a graph illustrating positions of frequency peaks of an image of the pixel array pattern of FIG. 19A; and FIG. 19C is a view obtained by enlarging the graph of FIG. 19B, in which exemplary frequency peaks of a mesh pattern of the conductive film to be superimposed on the pixel array pattern of FIG. 18A are superimposed on the pixel array pattern.

DETAILED DESCRIPTION OF THE INVENTION

Hereinafter, a conductive film and a method for evaluating a conductive film according to the present invention will be described in detail with reference to preferred embodiments illustrated in the accompanying drawings.

In the following description, a conductive film for a touch panel will be explained as a representative example of the conductive film according to the present invention. However, the present invention is not limited to this example, and needless to say, as long as the conductive film is a conductive film installed on a display unit of a display device such as a liquid crystal display (LCD), a plasma display panel (PDP), an organic electroluminescence display (OLED), an inorganic EL display, or the like, it may be, for example, a conductive film for electromagnetic wave-shielding, or the like.

Figure 1:
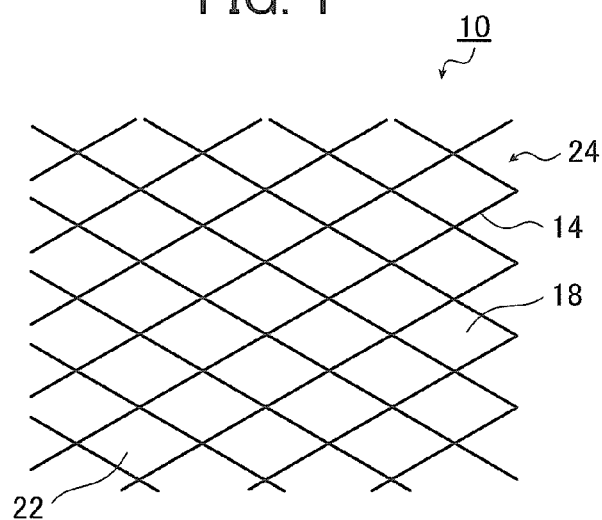
FIG. 1 is a plan view schematically showing an example of a conductive film according to a first embodiment of the present invention.
Figure 2:
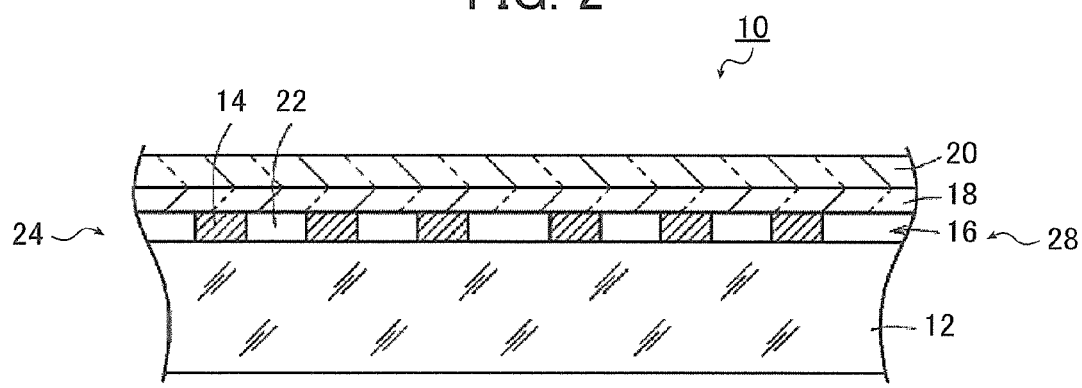
FIG. 2 is a schematic partial cross-sectional view of the conductive film shown in FIG. 1.

FIG. 1 is a plan view schematically showing an example of a conductive film according to a first embodiment of the present invention, and FIG. 2 is a schematic partial cross-sectional view of the conductive film shown in FIG. 1.

As shown in the drawings, a conductive film 10 according to this embodiment is installed on a display unit of a display device and is a conductive film having a wiring pattern that is excellent in suppression of occurrence of moire with respect to a black matrix (BM) of the display unit, particularly, a conductive film having a wiring pattern which is optimized in terms of moire recognition property with respect to the BM pattern when the conductive film is superimposed on the BM pattern. The conductive film 10 includes a transparent substrate 12, a conductive portion 16 that is formed on one surface of the transparent substrate 12 (on the upper surface in FIG. 2) and that is formed of a plurality of thin wires made of metal (hereinafter, referred to as thin metal wires) 14, and a protective layer 20 bonded to approximately the whole surface of the conductive portion 16 through an adhesive layer 18 so as to cover the thin metal wires 14.

The transparent substrate 12 is formed of a material having an insulating property and having a high translucency, and examples thereof include a resin, a glass, and silicon. Examples of the resin include Polyethylene Terephthalate (PET), Polymethyl methacrylate (PMMA), polypropylene (PP), polystyrene (PS), and the like.

The conductive portion 16 is composed of a conductive layer 28 having a wiring pattern 24 of a mesh shape formed of the thin metal wires 14 and openings 22 between neighboring thin metal wires 14. The thin metal wire 14 is not particularly limited as long as it is a thin wire made of metal having high conductivity, and examples of the thin metal wire include a thin wire made of gold (Au), silver (Ag), copper (Cu), or the like. The line width of the thin metal wire 14 is preferably small in terms of recognition property, and can be, for example, less than or equal to 30 µm. For application to a touch panel, the line width of the thin metal wires 14 preferably ranges from 0.1 µm to 15 µm, more preferably ranges from 1 µm to 9 µm, and even more preferably ranges from 2 µm to 7 µm.

Specifically, the conductive portion 16 has the wiring pattern 24 in which the plurality of thin metal wires 14 has been arranged in the form of a mesh. In the illustrated example, the mesh shape of the opening 22 is a rhombic, but the present invention is not limited thereto. Any polygonal shape having at least three sides may be employed as long as it can constitute the wiring pattern 24 optimized in terms of moire recognition property with respect to a predetermined BM pattern which will be described later. The mesh shapes may be the same as or different from each other, and examples thereof include polygons that are the same as or different from each other, such as triangles, for example, a regular triangle and an equilateral triangle; quadrangles (rectangles), for example, a square (a square lattice: refer to FIG. 16D which will be described later), a rectangle and a parallelogram (refer to FIG. 17 which will be described later); pentagons; and hexagons (a regular hexagon: refer to FIGS. 16B and 16C which will be described later). That is, as long as it is a wiring pattern optimized in terms of moire recognition property with respect to the BM pattern, a wiring pattern formed by the arrangement of openings 22 having regularity or a wiring pattern randomized by the arrangement of openings 22 having different shapes may be employed.

The mesh shape of the opening 22 of the wiring pattern 24 may be symmetrical or asymmetrical. When one of the x-axis and y-axis is defined on two-dimensional xy coordinates, if the mesh shape is asymmetrical with respect to at least one of the x-axis and the y-axis, the mesh shape can be defined to be asymmetrical.

For example, in a case of a parallelogrammic mesh shape of an asymmetrical pattern, as shown in FIG. 17, provided that a pitch of each side of the parallelogram is p1 and p2, and an angle of inclination of each side of the parallelogram with respect to the y-axis is θ1 and θ2, the mesh shape just need to satisfy at least one of a condition of p1≠p2 and a condition of θ1≠θ2. However, the mesh shape more preferably satisfies both the conditions. In the parallelogrammic mesh shape of the asymmetrical pattern shown in the drawing, p1≠p2, and θ1=θ2.

Other polygonal mesh shapes of an asymmetrical pattern may be defined to be asymmetrical when at least one of the pitch and the angle of inclination varies.

Figure 14:
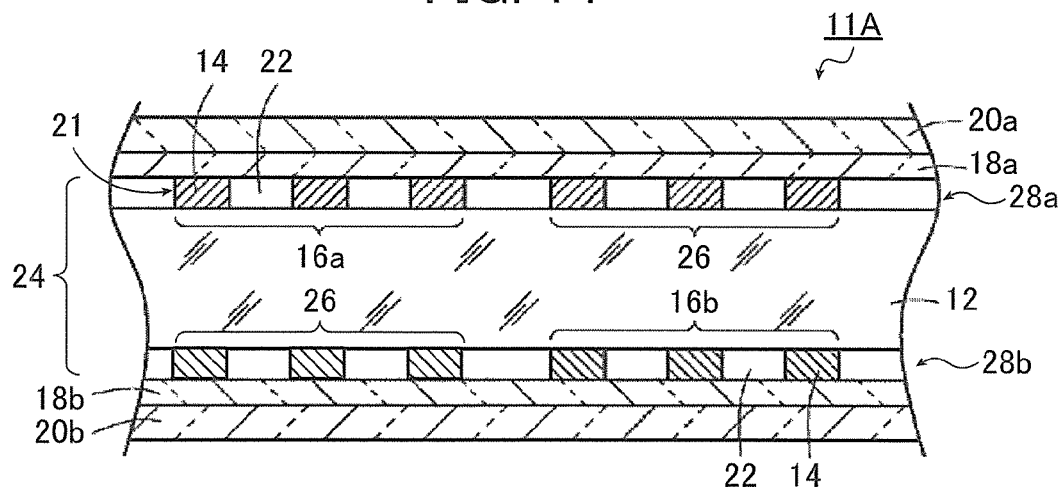
FIG. 14 is a partial cross-sectional view schematically showing an example of a conductive film according to another embodiment of the present invention.

As shown in FIG. 14 which will be described later, disconnections (breaks) may be formed in the wiring pattern 24. As the shape of the mesh-like wiring pattern having the breaks, it is possible to adopt the shape of the mesh-like wiring pattern of the conductive film described in Japanese Patent Application No. 2012-276175 filed by the applicant of the present application.

As materials of the adhesive layer 18, a wet laminate adhesive, a dry laminate adhesive, a hot melt adhesive, or the like can be mentioned.

As the transparent substrate 12, the protective layer 20 is formed of a material having a high translucency, such as a resin, a glass, and silicon. The refractive index n1 of the protective layer 20 is preferably a value that is equal to or close to the refractive index n0 of the transparent substrate 12. In this case, the relative refractive index nr1 of the transparent substrate 12 with respect to the protective layer 20 becomes a value close to 1.

Herein, the refractive index in this specification means a refractive index for light with a wavelength of 589.3 nm (D line of sodium). For example, in regard to resins, the refractive index is defined by ISO 14782: 1999 (corresponding to JIS K 7105) that is an international standard. In addition, the relative refractive index nr1 of the transparent substrate 12 with respect to the protective layer 20 is defined as nr1=(n1/n0). Herein, it is preferable that the relative refractive index nr1 is in a range of 0.86 or more and 1.15 or less, and a range of 0.91 or more and 1.08 or less is more preferable.

By limiting the relative refractive index nr1 to this range and controlling light transmittance between members of the transparent substrate 12 and the protective layer 20, it is possible to further improve the moire recognition property.

The conductive film 10 according to the first embodiment described above has the conductive portion 16 on only one surface of the transparent substrate 12, but the present invention is not limited to this configuration, and the conductive film 10 may have the conductive portions 16 on both surfaces of the transparent substrate 12.

Figure 3:
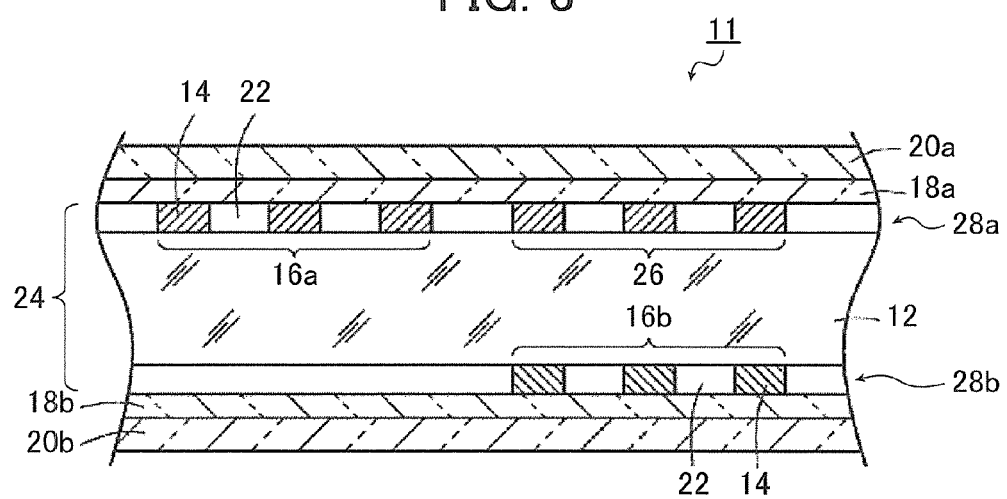
FIG. 3 is a schematic partial cross-sectional view of an example of a conductive film according to a second embodiment of the present invention.

FIG. 3 is a schematic partial cross-sectional view of an example of a conductive film according to a second embodiment of the present invention. The plan view of the conductive film according to the second embodiment shown in FIG. 3 is the same as the plan view of the conductive film according to the first embodiment shown in FIG. 1, and accordingly, will not be shown herein.

As shown in the drawing, the conductive film 11 according to the second embodiment includes a first conductive portion 16a and a dummy electrode portion 26 formed on one surface (on the upper side of FIG. 3) of the transparent substrate 12, a second conductive portion 16b formed on the other surface (on the lower side of FIG. 3) of the transparent substrate 12, a first protective layer 20a bonded to the substantially entire surface of the first conductive portion 16a and the first dummy electrode portion 26a through a first adhesive layer 18a, and a second protective layer 20b boned to the substantially entire surface of the second conductive portion 16b through a second adhesive layer 18b.

In the conductive film 11, the first conductive portion 16a and the dummy electrode portion 26 each include plural thin metal wires 14 and are formed on one surface (on the upper side of FIG. 3) of the transparent substrate 12 as a conductive layer 28a, and the second conductive portion 16b includes plural thin metal wires 14 and is formed on the other surface (on the lower side of FIG. 3) of the transparent substrate 12 as a conductive layer 28b. Herein, the dummy electrode portion 26 is formed on one surface (on the upper side of FIG. 3) of the transparent substrate 12 as the first conductive portion 16a, and includes plural thin metal wires 14 which are similarly arranged at positions corresponding to the plural thin metal wires 14 of the second conductive portion 16b formed on the other surface (on the lower side of FIG. 3), as illustrated in the drawing.

The dummy electrode portion 26 is disposed to be separated from the first conductive portion 16a by a predetermined distance and is in the state of being electrically insulated from the first conductive portion 16a.

In the conductive film 11 according to this embodiment, since the dummy electrode portion 26 composed of plural thin metal wires 14 corresponding to the plural thin metal wires 14 of the second conductive portion 16b formed on the other surface (on the lower side of FIG. 3) of the transparent substrate 12 is formed on one surface (on the upper side of FIG. 3) of the transparent substrate 12, scattering due to the thin metal wires on the one surface (on the upper side of FIG. 3) of the transparent substrate 12 can be controlled, and it is thus possible to improve electrode recognition property.

Herein, the first conductive portion 16a of the conductive layer 28a and the dummy electrode portion 26 have a wiring pattern 24 of a mesh shape formed by the thin metal wires 14 and the openings 22. The second conductive portion 16b of the conductive layer 28b has a wiring pattern 24 of a mesh shape formed by the thin metal wires 14 and the openings 22, as the first conductive portion 16a. As described above, the transparent substrate 12 is formed of an insulating material and the second conductive portion 16b is in the state of being electrically insulated from the first conductive portion 16a and the dummy electrode portion 26.

In addition, the first and second conductive portions 16a and 16b and the dummy electrode portion 26 can be similarly formed of the same material as the conductive portion 16 of the conductive film 10 illustrated in FIG. 2.

The first protective layer 20a is bonded to the substantially entire surface of the conductive layer 28a composed of the first conductive portion 16a and the dummy electrode portion 26 with the first adhesive layer 18a so as to cover the thin metal wires 14 of the first conductive portion 16a and the dummy electrode portion 26.

The second protective layer 20b is bonded to the substantially entire surface of the conductive layer 28b composed of the second conductive portion 16*b* with the second adhesive layer 18*b* so as to cover the thin metal wires 14 of the second conductive portion 16*b*.

Herein, the first adhesive layer 18*a* and the second adhesive layer 18*b* can be similarly formed of the same material as the adhesive layer 18 of the conductive film 10 illustrated in FIG. 2, and the material of the first adhesive layer 18*a* may be equal to or different from the material of the second adhesive layer 18*b*.

The first protective layer 20*a* and the second protective layer 20*b* can be similarly formed of the same material as the protective layer 20 of the conductive film 10 illustrated in FIG. 2, and the material of the first protective layer 20*a* may be equal to or different from the material of the second protective layer 20*b*.

Both the refractive index n2 of the first protective layer 20*a* and the refractive index n3 of the second protective layer 20*b* may be a value equal or close to the refractive index n0 of the transparent substrate 12, as the protective layer 20 of the conductive film 10 according to the first embodiment. In this case, both the relative refractive index nr2 of the transparent substrate 12 with respect to the first protective layer 20*a* and the relative refractive index nr3 of the transparent substrate 12 with respect to the second protective layer 20*b* are a value close to 1. Herein, the definitions of the refractive index and the relative refractive index are the same as the definitions as in the first embodiment. Accordingly, the relative refractive index nr2 of the transparent substrate 12 with respect to the first protective layer 20*a* is defined as nr2=(n2/n0), and the relative refractive index nr3 of the transparent substrate 12 with respect to the second protective layer 20*b* is defined as nr3=(n3/n0).

Herein, as the relative refractive index nr1, it is preferable that the relative refractive index nr2 and the relative refractive index nr3 are in a range of 0.86 or more and 1.15 or less, and a range of 0.91 or more and 1.08 or less is more preferable.

By limiting the relative refractive index nr2 and the relative refractive index nr3 to this range, it is possible to further improve the moire recognition property, as the limitation of the range of the relative refractive index nr1.

Figure 4:
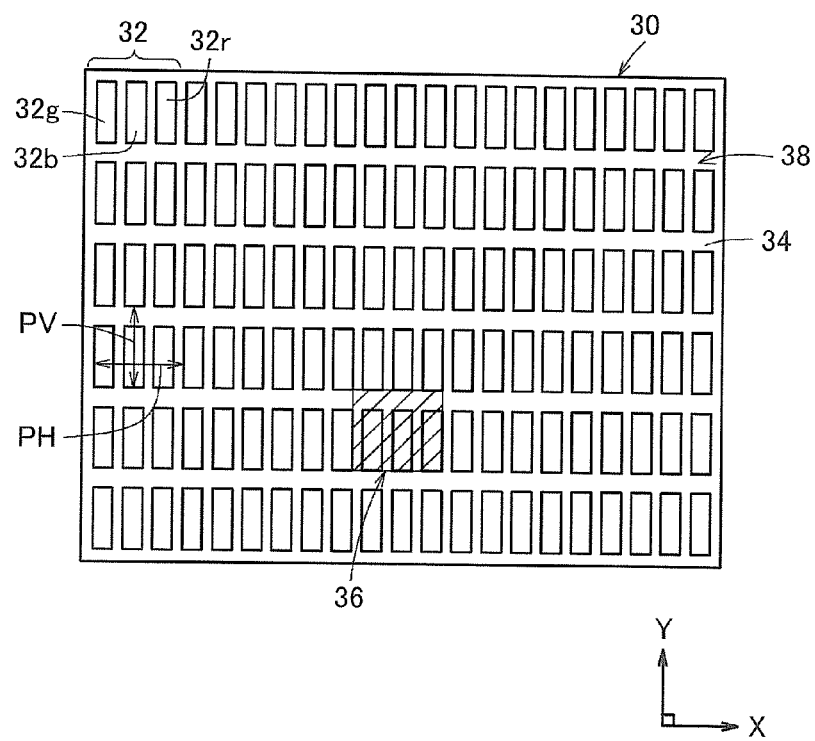
FIG. 4 is a schematic view illustrating an example of a pixel array pattern of a portion of a display unit to which the conductive film according to the present invention is applied.

The conductive film 10 of the first embodiment and the conductive film 11 of the second embodiment of the present invention described above are applied to, for example, a touch panel of a display unit 30 (display portion) a portion of which is schematically shown in FIG. 4. The conductive films have a wiring pattern optimized in terms of the moire recognition property with respect to the pixel array pattern of the display unit 30, that is, the black matrix (hereinafter, also referred to as "BM") pattern, when the wiring pattern is observed from at least one visual point. In the present invention, the wiring pattern optimized in terms of the moire recognition property with respect to the BM (pixel array) pattern refers to one, two, or more groups of wiring patterns in which moire with respect to a predetermined BM pattern is not visually recognized by a human being when the wiring patterns are observed from at least one visual point. Furthermore, in the present invention, in two or more groups of optimized wiring patterns, it is possible to rank the wiring patterns from a wiring pattern which is most unlikely to be visually recognized to a wiring pattern which is less likely to be visually recognized, and one wiring pattern in which moire is most unlikely to be visually recognized can be determined.

The optimization of the moire recognition property of a wiring pattern with respect to a predetermined BM pattern will be described later.

The conductive film of the present invention is basically constituted as above.

FIG. 4 is a schematic view illustrating an example of a pixel array pattern of a portion of a display unit to which the conductive film according to the present invention is applied.

As a portion thereof is illustrated in FIG. 4, plural pixels 32 are arranged in a matrix shape to form a predetermined pixel array pattern in the display unit 30. One pixel 32 has a configuration in which three sub-pixels (a red sub-pixel 32*r*, a green sub-pixel 32*g*, and a blue sub-pixel 32*b*) are arranged in the horizontal direction. One sub-pixel has a rectangular shape which is long in the vertical direction. The three sub-pixels 32*r*, 32*g*, and 32*b* have the same or similar rectangular shape. The array pitch in the horizontal direction (horizontal pixel pitch PH) of the pixels 32 and the array pitch in the vertical direction (vertical pixel pitch PV) of the pixels 32 are substantially equal to each other. That is, a shape formed by one pixel 32 and a black matrix (BM) 34 (pattern material) surrounding the one pixel 32 is square (refer to a hatched area 36). The aspect ratio of one pixel 32 is not equal to 1, but set to be the length in the horizontal direction (lateral)>the length in the vertical direction (longitudinal).

In the example shown in the drawing, the shape of a single sub-pixel (32*r*, 32*g*, or 32*b*) is rectangular, but the present invention is not limited thereto. For example, as shown in FIG. 7C which will be described later, the single sub-pixel may have a shape of a rectangle having a notch at the end thereof. Furthermore, as shown in FIG. 8A which will be described later, the single sub-pixel may have a shape of a vertically long band that is bent or folded by a predetermined angle. Alternatively, the single sub-pixel may have a shape of a vertically long curved band. Moreover, a notch may be formed at the end of the sub-pixel, and the notch may have any shape. That is, the single sub-pixel may have any shape as long as the shape is a conventionally known pixel shape.

In addition, a pixel pitch (a horizontal or vertical pixel pitch PH or PV) may be arbitrarily set as long as the pitch is appropriate for the resolution of the display unit 30. For example, the pitch can be increased within a range of 84 μm to 264 μm.

As can be apparently seen from FIG. 4, since the pixel array pattern formed by the sub-pixels 32*r*, 32*g*, and 32*b* of the plural pixels 32 is defined by the BM pattern 38 of the BM 34 surrounding the respective sub-pixels 32*r*, 32*g*, and 32*b* and the moire occurring when the display unit 30 and the conductive film 10 or 11 are superimposed on each other is generated by the interference between the BM pattern 38 of the BM 34 of the display unit 30 and the wiring pattern 24 of the conductive film 10 or 11, the BM pattern 38 is strictly an inverted pattern of the pixel array pattern, but herein, both are treated to represent the same pattern.

For example, when the conductive film 10 or 11 is disposed on the display panel of the display unit 30 having the BM pattern 38 formed by the BM 34, since the wiring pattern 24 of the conductive film 10 or 11 has been optimized in terms of the moire recognition property with respect to the BM (pixel array) pattern 38, there is no interference in spatial frequency between the array period of the pixels 32 and the wiring arrangement of the thin metal wires 14 of the conductive film 10 or 11, and thus occurrence of moire is suppressed.

The display unit 30 illustrated in FIG. 4 may be configured as a display panel such as a liquid crystal panel, a plasma panel, an organic EL panel, and an inorganic EL panel.

Figure 5:
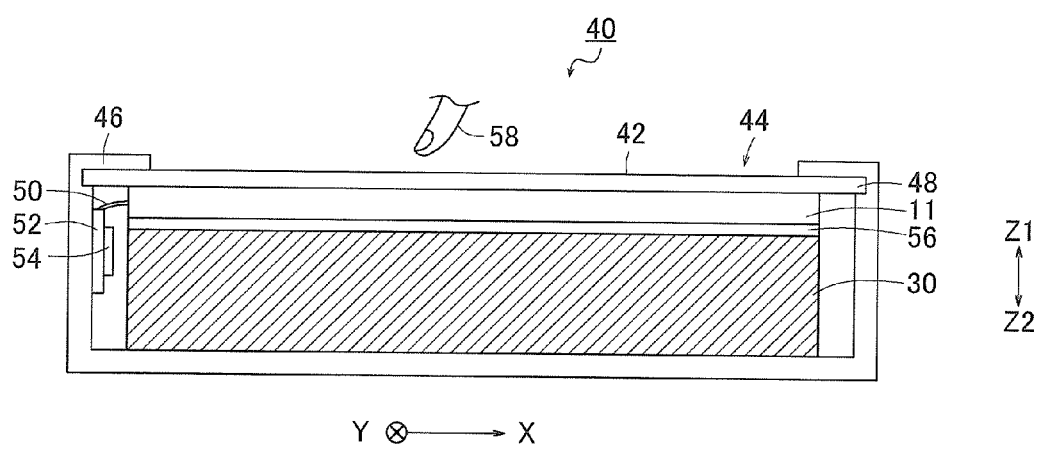
FIG. 5 is a schematic cross-sectional view of an example of a display device in which the conductive film shown in FIG. 3 is incorporated.

Next, a display device into which the conductive film according to the present invention is assembled will be described below with reference to FIG. 5. In FIG. 5, a projected capacitive type touch panel into which the conductive film 11 according to the second embodiment of the present invention is assembled will be described as a representative example of the display device 40, but it is needless to say that the present invention is not limited to this example.

As shown in FIG. 5, the display device 40 includes the display unit 30 (refer to FIG. 3) that can display a color image and/or a monochrome image, a touch panel 44 that detects a contact position from an input screen 42 (arrow Z1 direction side), and a housing 46 in which the display unit 30 and the touch panel 44 are housed. The user can access the touch panel 44 through a large opening provided on the surface (arrow Z1 direction side) of the housing 46.

The touch panel 44 includes not only the conductive film 11 (refer to FIGS. 1 and 3) described above but also a cover member 48 laminated on the surface (arrow Z1 direction side) of the conductive film 11, a flexible substrate 52 electrically connected to the conductive film 11 through a cable 50, and a detection control unit 54 disposed on the flexible substrate 52.

The conductive film 11 is bonded to the surface (arrow Z1 direction side) of the display unit 30 through an adhesive layer 56. The conductive film 11 is disposed on the display screen such that the other main surface side (second wiring layer 16*b* side) faces the display unit 30.

The cover member 48 functions as the input screen 42 by covering the surface of the conductive film 11. In addition, by preventing direct contact of a contact body 58 (for example, a finger or a stylus pen), it is possible to suppress the occurrence of a scratch, adhesion of dust, and the like, and thus it is possible to stabilize the conductivity of the conductive film 11.

For example, the material of the cover member 48 may be a glass or a resin film. One surface (arrow Z2 direction side) of the cover member 48 may be coated with silicon oxide or the like and may be bonded to one surface (arrow Z1 direction side) of the conductive film 11. In order to prevent damage due to rubbing or the like, the conductive film 11 and the cover member 48 may be pasted together.

The flexible substrate 52 is an electronic substrate having flexibility. In the example shown in the drawing, the flexible substrate 52 is fixed to the inner wall of the side surface of the housing 46, but the position fixedly set up may be changed in various ways. The detection control unit 54 constitutes an electronic circuit that catches a change in the capacitance between the contact body 58 and the conductive film 11 and detects the contact position (or the proximity position) when the contact body 58 that is a conductor is brought into contact with (or comes close to) the input screen 42.

The display device to which the conductive film according to the present invention is applied basically has the above-mentioned configuration.

Next, procedures of evaluation and optimization of the moire recognition property of the wiring pattern of the conductive film with respect to a predetermined BM pattern of the display device in the present invention will be described below. That is, in the conductive film according to the present invention, the procedures of evaluating and determining a wiring pattern, which is optimized so that moire with respect to a predetermined BM pattern of the display device is not visually recognized by a human being when the wiring pattern is observed from at least one visual point, will be described below.

FIG. 6 is a flowchart showing an example of a method for evaluating the conductive film according to the present invention.

The method for evaluating the wiring pattern of the conductive film of the present invention is a method in which from the frequencies/intensities of moires that are obtained by the frequency analysis using Fast Fourier Transform (FFT) of the BM (pixel array) pattern of the display unit of the display device and the wiring pattern of the conductive film, the moires (frequencies/intensities) are selected which have frequencies equal to or lower than the maximum frequency of moire that is specified according to the display resolution of the display unit; the visual response characteristics of a human being are applied to the intensity of each of the selected moires according to an observation distance at the frequency of each of the moires so as to obtain evaluation values of the moires; from the obtained evaluation values of the plurality of moires, an evaluation index of moire is calculated; and a wiring pattern in which the calculated evaluation index of moire satisfies preset conditions is evaluated and determined to be a wiring pattern that has been optimized so as to prevent the moire from being visually recognized. In the method of the present invention, FFT is generally used for obtaining the frequencies/intensities of moires. However, depending on the usage of FFT, the frequencies/intensities of targets greatly vary. Accordingly, the following procedures are specified.

Herein, a case is considered in which the display screen of the display unit of the display device is observed from the front as a single visual point. However, the present invention is not limited thereto, and the display screen may be observed from any visual point, as long as the moire recognition property in the case of observing the display screen from at least a single visual point can be improved.

In the method of the present invention, first, as Procedure 1, an image (transmittance image data) of each of the BM pattern and the wiring pattern is created. That is, as shown in FIG. 6, in Step S10, transmittance image data of the BM pattern 38 (BM 34) (see FIG. 4) of the display unit 30 of the display device 40 shown in FIG. 5 and transmittance image data of a wiring pattern 62 (thin metal wires 14) of a conductive film 60 (see FIG. 7B) are created and obtained. Herein, when the transmittance image data of the BM pattern 38 and the transmittance image data of the wiring pattern 62 have already been prepared or accumulated, the transmittance image data may be obtained from the prepared or accumulated data.

Figure 7A:
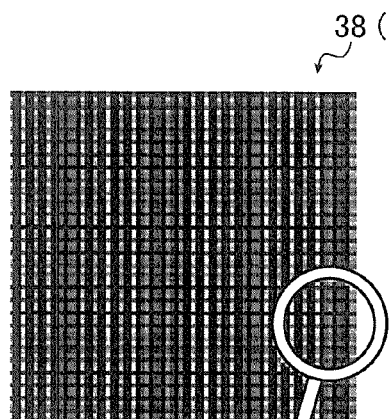
FIG. 7A is a schematic view illustrating an example of a pixel array pattern of a display unit to which the conductive film according to the present invention is applied.
Figure 7B:
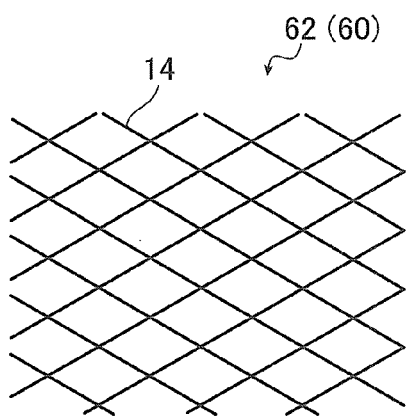
FIG. 7B is a schematic view illustrating an example of a wiring pattern of the conductive film superimposed on the pixel array pattern of FIG. 7A.
Figure 7C:
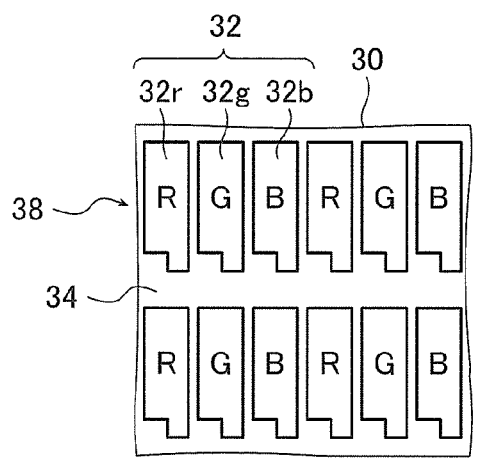
FIG. 7C is a partially enlarged view of the pixel array pattern of FIG. 7A.
Figure 8A:
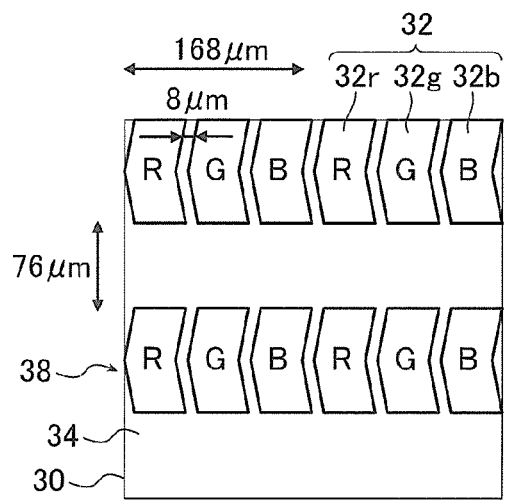
FIG. 8A is a partially enlarged view schematically illustrating another example of the pixel array pattern of the display unit to which the conductive film according to the present invention is applied.

For example, as illustrated in FIG. 7A and FIG. 7C which is a partially enlarged view of FIG. 7A, the BM pattern 38 of the display unit 30 can be set to a pattern in which each pixel 32 includes three color sub-pixels 32*r*, 32*g*, and 32*b* of RGB, but when a single color is used and, for example, only the sub-pixels 32*g* of G-channel are used as shown in FIG. 7C, it is preferable that the transmittance image data of R channel and B channel are set to 0. In the present invention, the image data of the BM 34, that is, the transmittance image data of the BM pattern 38 is not limited to FIG. 7C in which the BM 34 has openings (sub-pixels 32*r*, 32*g*, and 32*b*) having an approximately rectangular shape (with a notch). As long as the BM pattern is usable, the BM pattern may not have the rectangular openings of the BM 34, or a BM pattern having BM openings with any shape may be designated and used. For example, as described above, the BM pattern 38 is limited neither to the pattern having a simple rectangular shape as shown in FIG. 4 and FIG. 18A which will be described later nor to the pattern having rectangular openings with a notch shown in FIG. 7A. As shown in FIG. 19A which will be described later, the BM pattern may be a pattern in which rectangular openings are inclined by a predetermined angle. Furthermore, as shown in FIG. 8A, the BM pattern may be a pattern which has a band-like opening bent by a predetermined angle for a single pixel 32 and includes sub-pixels 32r, 32g, and 32b of RGB three colors. Alternatively, the BM pattern may be a pattern having band-like curved openings or a pattern having hook-like openings.

Figure 7D:
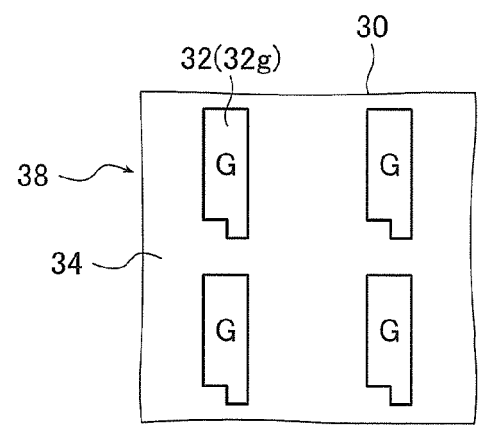
FIG. 7D is a view schematically illustrating the pixel array pattern in a case of using only sub-pixels of G channel in FIG. 7C.
Figure 8B:
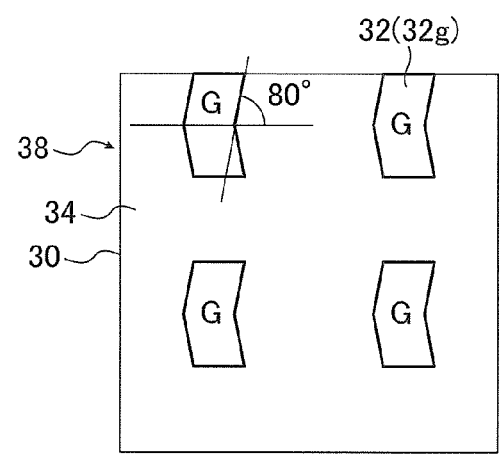
FIG. 8B is a view schematically illustrating the pixel array pattern in a case of using only sub-pixels of G channel in FIG. 8A.

Similarly to FIG. 7D, FIG. 8B shows the BM pattern in a case of using only a single color of the sub-pixel 32g of the G channel. FIGS. 18A and 19A which will be described later also show the BM pattern in a case of using only a single color of the sub-pixel 32r of a single channel, for example, the R channel.

For example, as shown in FIG. 7B, the wiring pattern 62 of the conductive film 60 can be a rhombic pattern in which the thin metal wires 14 that will become wiring incline with respect to the horizontal line by a predetermined angle, for example, an angle of less than 45° [deg]. However, as described above, the opening of the wiring pattern may have any shape. For example, the opening may have a shape of a regular hexagon or a square lattice as shown in FIGS. 16B to 16D which will be described later. Needless to say, the square lattice may be in the form of a square lattice inclining by 45° [deg].

Herein, at the time of creating the transmittance image data of the BM pattern 38, the size of the transmittance image data is specified by setting resolution thereof to be, for example, 12,700 dpi which is high resolution. For instance, an integer multiple of the size of the BM pattern 38 closest to 8,193 (pixels)×8,193 (pixels) is taken as the pixel size.

Furthermore, at the time of creating the transmittance image data of the wiring pattern 62, the size of the transmittance image data is specified by setting the resolution thereof to be, for example, 12,700 dpi which is the same as the resolution of the BM pattern 38. For example, similarly to the BM pattern 38, an integer multiple of the size of the wiring pattern 62 closest to 8,193 (pixels)×8,193 (pixels) is taken as the pixel size.

Thereafter, as Procedure 2, two-dimensional fast Fourier transform (2DFFT (base 2)) is performed on the transmittance image data created in Procedure 1. That is, as shown in FIG. 6, in Step S12, 2DFFT (base 2) processing is performed on the respective transmittance image data of the BM pattern 38 and the wiring pattern 62 that are created in Step S10, thereby calculating peak frequencies and peak intensities of a plurality of spectral peaks of two-dimensional Fourier spectra of the respective transmittance image data of the BM pattern 38 and the wiring pattern 62. Herein, the peak intensity is handled as an absolute value.

FIG. 9A is a view showing intensity characteristics of two-dimensional Fourier spectra of transmittance image data of the BM pattern 38, and FIG. 9B is a view showing intensity characteristics of two-dimensional Fourier spectra of transmittance image data of the wiring pattern 62.

In FIGS. 9A and 9B, a white portion indicates a spectral peak having high intensity. Accordingly, from the results shown in FIGS. 9A and 9B, the peak frequency and peak intensity of each spectral peak are calculated for each of the BM pattern 38 and the wiring pattern 62. That is, the position on frequency coordinates of each of the spectral peaks shown in the intensity characteristics of the two-dimensional Fourier spectra of the BM pattern 38 and the wiring pattern 62 shown in FIGS. 9A and 9B respectively, that is, the peak position represents the peak frequency, and the intensity of the two-dimensional Fourier spectrum in the peak position represents the peak intensity.

The peak frequency and peak intensity of each of the spectral peaks of the BM pattern 38 and the wiring pattern 62 are calculated and obtained as below.

First, in calculating peaks for obtaining the peak frequency, from the basic frequencies of the BM pattern 38 and the wiring pattern 62, frequency peaks are calculated. This is because the transmittance image data subjected to the 2DFFT processing is discrete values, and thus the peak frequency depends on the reciprocal of the image size. As shown in FIG. 10, the positions of the frequency peaks can be expressed as a combination of bars a and b which are independent two-dimensional basic frequency vector components. Accordingly, naturally, the obtained peak positions form a lattice shape.

That is, as shown in FIG. 11A, the positions of the spectral peaks of the BM pattern 38 and the wiring pattern 62 on frequency coordinates fx and fy, in other words, the peak positions are given as positions in the form of lattice-like points on the frequency coordinates fx and fy in which a reciprocal (1/p (pitch)) of the pattern pitch is set to be a lattice interval.

Although FIG. 10 is a graph showing positions of frequency peaks in the case of the BM pattern 38, the peak positions of the wiring pattern 62 can also be determined in the same manner.

Since the peak position is determined in the process of obtaining the peak frequency described above, in obtaining the peak intensity, the intensity (absolute value) of the two-dimensional Fourier spectrum that the peak position has is obtained. At this time, because digital data has undergone FFT processing, the peak position includes a plurality of pixels in some cases. For example, when the intensity (Sp) characteristics of the two-dimensional Fourier spectrum are represented by a curve (analogue value) shown in FIG. 12A, the intensity characteristics of the same two-dimensional Fourier spectrum having undergone digitalization processing is represented by a bar graph (digital value) shown in FIG. 12B. Herein, a peak P of the intensity of the two-dimensional Fourier spectrum shown in FIG. 12A extends over two pixels in the corresponding FIG. 12B.

Consequently, in order to obtain the intensity in the peak position, as shown in FIG. 11B, within a region including a plurality of pixels in the vicinity of the peak position, the sum of spectral intensities of a plurality of pixels ranked high in terms of the spectral intensity is preferably used as the peak intensity. For example, within a region of 7×7 pixels, the sum of intensities (absolute values) of top 5 pixels ranked high in terms of the spectral intensity is preferably used as the peak intensity.

Herein, the obtained peak intensity is preferably standardized by using the image area (image size). In the aforementioned example, the peak intensity is preferably standardized in advance by using the image size of 8,192×8,192 (Parseval's theorem).

Subsequently, as Procedure 3; the frequencies and intensities of the moires are calculated. That is, as shown in FIG. 6, in Step S14, from the peak frequencies and peak intensities of the two-dimensional Fourier spectra of both the BM pattern 38 and the wiring pattern 62 calculated in Step S12, the frequencies and intensities of the moires are calculated respectively. Herein, each of the peak intensity and the intensity of moire is also handled as an absolute value.

Originally, in the actual space, the moire is caused by the multiplication of the transmittance image data of the wiring pattern 62 and the BM pattern 38. Consequently, in the frequency space, convolution integral of the patterns is performed. However, since the peak frequencies and peak intensities of the two-dimensional Fourier spectra of both the BM pattern 38 and the wiring pattern 62 are calculated in Step S12, a difference (an absolute value of the difference) in the frequency peak between the two patterns can be calculated; the calculated difference can be taken as the frequency of moire; a product of 2 vector intensities obtained by combining the two patterns can be calculated; and the calculated product can be taken as the intensity (absolute value) of moire.

Herein, the difference between the frequency peaks of the respective intensity characteristics of the two-dimensional Fourier spectra of the BM pattern 38 and the wiring pattern 62 respectively shown in FIGS. 9A and 9B corresponds to the relative distance between the peak positions on the frequency coordinates of the frequency peaks of the BM pattern 38 and the wiring pattern 62 in the intensity characteristics obtained by superimposing the intensity characteristics of the two-dimensional Fourier spectra of both the patterns.

Each of the BM pattern 38 and the wiring pattern 62 has a plurality of spectral peaks of the two-dimensional Fourier spectra thereof. Therefore, the difference between the frequency peaks that is a value of the relative distance, that is, the frequency of the moire, is obtained in a plural number. Accordingly, if there are a large number of spectral peaks of the two-dimensional Fourier spectra, the number of the obtained frequencies and intensities of the moires is also increased.

However, when the intensity of moire at the obtained frequency is weak, the moire is not visually recognized. Therefore, it is preferable to handle only the moire of which the intensity is equal to or higher than a predetermined value to be considered as a weak intensity, for example, only the moire having intensity of equal to or greater than −4.

Herein, because the display resolution is preset in the display device, the maximum frequency that can be displayed by the display is determined according to the resolution. Consequently, the moire having a frequency higher than the maximum frequency is not displayed by the display, and therefore the moire does not need to be taken as a target of evaluation in the present invention. As a result, the maximum frequency of moire can be specified according to the display resolution. Accordingly, provided that a pixel pitch of the pixel array pattern of the display is p (μm), the maximum frequency of moire that should be considered in the present invention can be set to be 1,000/(2p).

For the aforementioned reasons, in the present invention, among the moires having the frequencies and intensities calculated from the spectral peaks of the two-dimensional Fourier spectra of the BM pattern 38 and the wiring pattern 62, the moires having a frequency, which is equal to or less than 1,000/(2p) as the maximum frequency of the moire specified according to the display resolution, and having intensity of equal to or higher than −4 are taken as the target of evaluation.

If the BM pattern 38 and the wiring pattern 62 have a large number of spectral peaks of the two-dimensional Fourier spectra, the number of the obtained frequencies of the moires is also increased, and as a result, it takes a long period of time for calculation processing. In such a case, for the spectral peaks of the two-dimensional Fourier spectra of both patterns, the peaks having low intensity may be ruled out, and only the peaks having high intensity of some sort may be selected. In this case, because only the difference between the selected peaks is calculated, the time taken for calculation can be shortened.

FIG. 13 shows the frequencies and intensities of moires obtained in this way. FIG. 13 is a view schematically illustrating the frequencies and intensities of moires that occur due to the interference between the pixel array pattern shown in FIG. 7A and the wiring pattern shown in FIG. 7B. FIG. 13 can also be regarded as being an outcome of the convolution integral of the intensity characteristics of the two-dimensional Fourier spectra shown in FIGS. 9A and 9B.

In FIG. 13, the frequency of moire is indicated by the position on the ordinate and abscissa, and the intensity of moire is indicated by the shade of grey (achromatic color). As shown in FIG. 13, the darker the color, the lower the intensity, and the lighter the color, that is, the closer the color is to white, the higher the intensity.

Subsequently, as Procedure 4, an evaluation index of moire is determined, and based on the evaluation index, the wiring pattern is evaluated.

Specifically, first, as shown in FIG. 6, in Step S16, the visual response characteristics of a human being represented by the following Equation (1) are applied to the frequencies and intensities (absolute values) of moires obtained in Step S14 according to the observation distance. That is, the frequencies and intensities of moires are subjected to weighting by convolution integral, thereby calculating evaluation values (subsidiary evaluation values) of a plurality of moires weighted according to the observation distance. In other words, the frequencies/intensities of moires are convoluted with a Visual Transfer Function (VTF) represented by the following Equation (1) that shows an example of visual response characteristics of a human being.

$$S(u) = \frac{5200 e^{-0.0016 u^2 (1+100/L)^{0.08}}}{\sqrt{\left(1 + \frac{144}{X_o^2} + 0.64 u^2\right)\left(\frac{63}{L^{0.83}} + \frac{1}{1 - e^{-0.02 u^2}}\right)}} \quad (1)$$

Herein, u represents a spatial frequency (cycle/deg); L represents brightness (cd/mm$^2$); $X_0$ represents a viewing angle (deg) of a display surface of a display at an observation distance; and $X_0^2$ represents a solid angle (sr) formed by the display surface of the display at the observation distance.

The visual transfer function represented by Equation (1) is the contrast sensitivity function (CFS) S(u) represented by Equation (11) described on page 234 of the research paper "Formula for the contrast sensitivity of the human eye" (Peter G. J. Barten, Image Quality and System Performance, edited by Yoichi Miyake, D. René Rasmussen, Proc. of SPIE-IS&T Electronic Imaging, SPIE Vol. 5294 ©2004 SPIE and IS&T•0277-786X/04/$15.00, P. 231-P. 238).

Unlike the Dooley Shaw function using a fixed observation distance that is frequently used in a reflection system and used in the technique described in Japanese Patent Application No. 2012-082711 filed by the applicant of the present application, Equation (1) can also be appropriately used in a transmission system such as a display, and by using Equation (1), the observation distance and the difference in sensitivity due to the emission brightness of a display can be taken into consideration.

That is, in the present invention, a single frequency of moire obtained is subjected to weighting by using the visual sensitivity (contrast sensitivity) S(u) determined by Equation (1) with respect to a plurality of observation distances, thereby obtaining evaluation values of a plurality of moires weighted with respect to the plurality of observation distances.

Specifically, for instance, provided that the frequency of moire is f, and the intensity moire is I, if convolution is performed by using observation distances d, for example, six kinds of observation distances d1 to d6 including 150 mm, 200 mm, 250 mm, 300 mm, 400 mm, and 500 mm that are likely to be used when the conductive film is used as a touch panel, and weighting is performed on the frequency of the moire by using a coefficient S which depends on each of the observation distances d1 to d6, it is possible to obtain six evaluation values I1 to I6 corresponding to the respective observation distances.

In the present invention, when a spatial frequency a (cycle/deg) is represented by a spatial frequency b (cycle/mm), if the observation distance is set to be d (mm), the unit of a spatial frequency u (cycle/deg) can be transformed into the unit of (cycle/mm) in Equation (1) through an equation of $a = b \cdot (\pi \cdot d/180)$.

As the brightness L ($cd/mm^2$), the brightness of a display may be used. For example, the brightness L may be set to be 500 cd that is a general brightness level of a display at which moire is easily visually recognized.

Furthermore, the viewing angle $X_0$ (deg) of the display surface of the display at the observation distance d may be adjusted and determined depending on the observation distance d such that the evaluation area becomes the display surface of the display. For instance, the viewing angle $X_0$ may be adjusted and determined depending on the observation distance d such that the evaluation area, which makes it easy for the moire to be visually recognized when the conductive film is used as a touch panel, becomes 40 mm×40 mm. From $X_0$ determined in this way, a solid angle $X_0^2$ (sr) formed by the display surface of the display at the observation distance d may be calculated.

Then, as shown in FIG. 6, in Step S18, in order to calculate an evaluation value (representative evaluation value) that represents a case in which the frequency of moire is f, the worst evaluation value among evaluation values I1 to In of a plurality of moires depending on a plurality of (a number of n) observation distances d1 to dn at the time when the frequency of the moire obtained in Step S16 is f is calculated. The calculated evaluation value is set to be a representative evaluation value at the time when the frequency of the moire is f.

That is, in the method for calculating an evaluation index of the present invention, first, the worst value among the evaluation values obtained as a result of convolution using the plurality of (a number of n) observation distances d1 to dn needs to be calculated and set to be a representative evaluation value of the frequency f of the moire.

For example, provided that the frequency and intensity of the moire is f and I respectively in the aforementioned example, convolution is performed by using the respective observation distances, that is, the aforementioned six kinds of observation distances d1 to d6. Thereafter, the worst value among the six evaluation values I1 to I6 obtained by performing weighting by using the coefficient S that depends on the respective observation distances d1 to d6 is taken as a representative value at the time when the frequency of the moire is f. That is, the representative evaluation value of the moire having the frequency f can be determined to be max (I1, I2, I3, I4, I5, and I6).

In this way, in Step S18, for the frequency f of all the moires obtained in Step S14, the worst evaluation value among the evaluation values I1 to In of the plurality of moires that depend on the plurality of (a number of n) observation distances d1 to dn is calculated and determined to be a representative evaluation value of the moire having the frequency f.

In the present invention, in order to evaluate the moire recognition property and to determine an optimized wiring pattern without depending on the observation distance d, the worst evaluation value among the evaluation values of the plurality of moires that depend on the observation distance d is taken as a representative evaluation value of the moire.

Subsequently, as shown in FIG. 6, in Step S20, all the representative evaluation values (the worst evaluation values at the plurality of observation distances d) that are respectively obtained in Step S18 with respect to the frequencies f of all the moires of the wiring pattern 62 are summed up, thereby calculating an evaluation index of moire. The value of the evaluation index of moire is expressed in terms of the common logarithm. That is, the value of the evaluation index of moire is determined in the form of the value of the common logarithm.

Thereafter, as shown in FIG. 6, in Step S22, if the value of the common logarithm of the evaluation index of moire of the wiring pattern 62 obtained as above is equal to or less than a predetermined value, the wiring pattern 62 is evaluated to be an optimized wiring pattern 62 (24) of the conductive film 60 (10) of the present invention, set to be an optimized wiring pattern 62 (24), and evaluated to be the conductive film 60 (10) of the present invention.

The value of the evaluation index of moire is restricted to be equal to or less than a predetermined value in terms of the common logarithm for the following reasons. That is, if the value of the evaluation index of moire is greater than a predetermined value, moire that has occurred due to the interference between the wiring pattern and the BM pattern superimposed on each other is visually recognized even though the moire is very faint, and the visually recognized moire is irritating to a user who sees it. If the value of the evaluation index of moire is equal to or less than a predetermined value, the moire is not so irritating to the user.

The predetermined value is appropriately set according to properties of the conductive film and the display device. Specifically, the predetermined value is appropriately set according to the properties of the wiring pattern 62 such as the line width of the thin metal wires 14, the shape, size (pitch or the like), or angle of the opening 22, the phase angle (rotation angle or deviation angle) of wiring patterns of two conductive layers, and the like, and the properties of the BM pattern 38 such as the shape, size (pitch or the like), or disposition angle thereof, and the like. However, for example, the predetermined value is preferably equal to or less than −1.75 expressed in terms of the common algorithm ($10^{-1.75}$ expressed in terms of the antilogarithm). That is, the value of the evaluation index of moire is preferably equal to or less than −1.75 expressed in terms of the common algorithm (equal to or less than $10^{-1.75}$ expressed in terms of the antilogarithm), more preferably equal to or less than −1.89 expressed in terms of the common algorithm, even more preferably equal to or less than −2.05 expressed in terms of the common algorithm, and most preferably equal to or less than −2.28 expressed in terms of the common algorithm.

For a large number of wiring patterns 62, the evaluation index of moire was determined by using simulation samples and actual samples, and three researchers were asked to visually observe moire that occurred due to the interference between the wiring pattern 62 and the BM pattern so as to perform sensory evaluation, although the details thereof will be described later. As a result, when the evaluation index of moire was equal to or less than −1.75 expressed in terms of the common logarithm, even if the moire that occurred due to the interference between the wiring pattern and the BM pattern superimposed on each other was visually recognized, the moire recognition property was equal to or higher than a level at which the moire was practically not irritating; when the evaluation index was equal to or less than −1.89 expressed in terms of the common logarithm, the moire recognition property was equal to or higher than a level at which the moire was hardly irritating even if it was visually recognized; when the evaluation index was equal to or less than −2.05 expressed in terms of the common logarithm, the moire recognition property was equal to or higher than a level at which the moire was not irritating; and when the evaluation index was equal to or less than −2.28 expressed in terms of the common logarithm, the moire recognition property was at a level at which the moire was not irritating at all.

Therefore, the present invention specifies that the evaluation index of moire is preferably within a range of equal to or less than −1.75 expressed in terms of the common logarithm (equal to or less than $10^{-1.75}$ expressed in terms of the antilogarithm), more preferably within a range of equal to or less than −1.89 expressed in terms of the common logarithm, even more preferably within a range of equal to or less than −2.05 expressed in terms of the common logarithm, and most preferably within a range of equal to or less than −2.28 expressed in terms of the common logarithm.

Needless to say, according to the line width of the thin metal wires 14 of the wiring pattern 62, the shape or size (pitch or angle) of the opening 22, the phase angle (rotation angle or deviation angle) of wiring patterns of two conductive layers, and the like, a plurality of optimized wiring patterns 62 is obtained. Among the wiring patterns 62, the one of which the value of the common logarithm of the evaluation index of moire is small is determined to be the best wiring pattern 62, and the plurality of optimized wiring patterns 62 can be ranked.

In this way, the method for evaluating wiring of a conductive film of the present invention ends. As a result, it is possible to prepare the conductive film of the present invention having an optimized wiring pattern which inhibits the occurrence of moire even being superimposed on the BM pattern of a display unit of a display device and exhibits excellent moire recognition property in any of display devices having different resolution regardless of the observation distance.

In the example of the conductive film 11 of the present invention shown in FIG. 3 described above, only a second conductive portion 16*b* is formed in a conductive layer 28*b*. However, the present invention is not limited thereto. Just like a conductive film 11A shown in FIG. 14, as in the conductive layer 28*a*, a dummy electrode portion 26 electrically insulated from a second conductive portion 16*b* may be disposed in positions corresponding to the plurality of thin metal wires 14 of a first conductive portion 16*a*. In this case, the conductive layer 28*a* and the conductive layer 28*b* can share the same wiring pattern 24, and the electrode recognition property can be further improved.

Furthermore, in the example shown in FIG. 14, the conductive layer 28*a* and the conductive layer 28*b* share the same wiring pattern 24, and form a single wiring pattern 24 by being superimposed on each other without deviating from each other. However, as long as the evaluation criteria of the present invention are satisfied, the wiring pattern of each of the conductive layer 28*a* and the conductive layer 28*b* may be superimposed on each other in a position in which they deviate from each other, or the wiring pattern of the conductive layer 28*a* may be different from the wiring pattern of the conductive layer 28*b*.

The aforementioned conductive film of the present invention has a mesh-like wiring pattern composed of continuous thin metal wires. However, the present invention is not limited thereto. As long as the evaluation criteria of the present invention are satisfied, the conductive film of the present invention may have a mesh-like wiring pattern in which disconnections (breaks) are formed in the thin metal wires just like the pattern shape of the mesh-like wiring pattern of the conductive film described in the aforementioned Japanese Patent Application No. 2012-276175 filed by the applicant of the present application.

Figure 15:
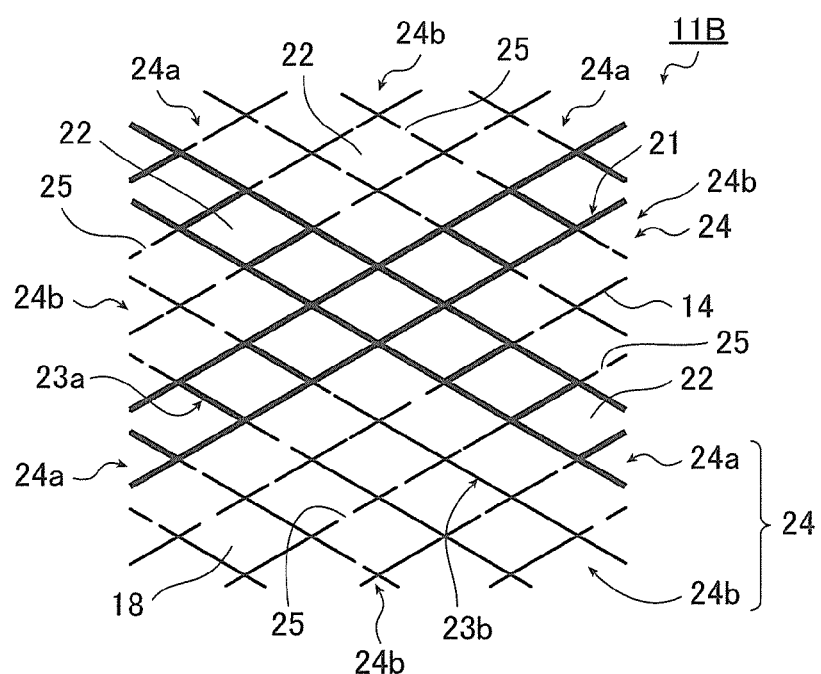
FIG. 15 is a partially enlarged plan view schematically showing an example of a conductive film according to another embodiment of the present invention, in which an example of a plurality of disconnection portions of a mesh pattern of the conductive film is described.

FIG. 15 is a partially enlarged plan view schematically showing another example of a conductive film according to another embodiment of the present invention, in which an example of a plurality of disconnection portions of a mesh pattern of the conductive film is described. In FIG. 15, for facilitating understanding, within the mesh-like wiring pattern of the mesh-like wiring of the conductive film, an electrode wiring pattern is indicated by a thick line, and a dummy electrode pattern is indicated by a fine line. However, both the patterns are formed of the same opaque thin metal wires, and needless to say, there is no difference in the thickness of the thin metal wires between the patterns.

In the conductive film 11B shown in FIG. 15, the conductive layer 28 shown in FIG. 1, the conductive layer 28*a* shown in FIG. 3, or each of the conductive layers 28*a* and 28*b* shown in FIG. 14 has the mesh-like wiring 21 composed of a plurality of thin metal wires 14. Specifically, the mesh-like wiring 21 has a wiring pattern in which the plurality of thin metal wires 14 in two directions is wired so as to cross each other. That is, the mesh-like wiring 21 has the mesh-like wiring pattern 24 in which the plurality of thin metal wires 14 is wired in the form of a mesh. In the example shown in the drawing, the mesh shape of the opening 22 formed by the wiring pattern 24 is rhombic and can be referred to as a diamond pattern.

The mesh-like wiring 21 has an electrode portion 23*a*, which includes an electrode wiring pattern 24*a* formed of the plurality of thin metal wires 14 in the form of a continuous mesh, and a dummy electrode portion (non-electrode portion) 23*b*, which is also formed of the plurality of thin metal wires in the form of a mesh, has a plurality of disconnection portions 25 and a discontinuous dummy electrode (non-electrode) wiring pattern 24*b*, and is insulated from the electrode portion 23*a*. In the example shown in the drawings, the electrode wiring pattern 24*a* of the electrode portion 23*a* and the dummy electrode wiring pattern 24*b* of the dummy electrode portion 23*b* are wiring patterns having the same mesh shape (rhomboid). By the synthesis of the electrode wiring pattern 24*a* and the dummy electrode wiring pattern 24*b*, the wiring pattern 24 of the mesh-like wiring 21 is formed.

The electrode portion 23*a* is constituted with the conductive portion 16 of the conductive layer 28 shown in FIG. 2, the first conductive portion 16*a* of the conductive layer 28*a* shown in FIG. 3, the first conductive portion 16*a* of the conductive layer 28*a* shown in FIG. 14, or the second conductive portion 16*b* of the conductive layer 28*b* shown in FIG. 14. Furthermore, the dummy electrode portion (non-electrode portion) 23*b* is constituted with the dummy electrode portion 26 shown in FIGS. 3 and 14.

Herein, the electrode wiring pattern 24*a* of the electrode portion 23*a* shown in the drawing is an electrode pattern constituting an X electrode. However, the present invention is not limited thereto. The electrode wiring pattern 24a may be any of the conventionally known electrode patterns such as a stripe electrode, a bar-and-stripe electrode, a diamond electrode, and a snowflake electrode, as long as it is an electrode pattern used in a capacitive type touch sensor (panel).

The thin metal wires 14 formed in the form of a mesh in the electrode portion 23a do not have the disconnection portions 25 and are continuous to each other. In contrast, in the thin metal wires 14 formed in the form of a mesh in the dummy electrode portion 23b, the plurality of disconnection portions (cut portions) 25 is formed, and a plurality of disconnections is added thereto. Between the thin metal wire 14 in the electrode portion 23a and the thin metal wire 14 in the dummy electrode portion 23b, the disconnection portion 25 is disposed without exception. Therefore, the thin metal wire 14 of the electrode portion 23a and the thin metal wire 14 of the dummy electrode portion 23b are disconnected from each other and in a discontinuous state. That is, the dummy electrode portion 23b and the electrode portion 23a are electrically insulated from each other.

As described above, the wiring pattern 24 of the mesh-like wiring 21 is a mesh pattern including the plurality of disconnection portions 25.

Incidentally, for example, as shown in FIGS. 4, 7C, 7D, and 18A, when the openings (sub-pixels 32r, 32g, and 32b) of pixels 32 of the BM 34 of the BM pattern 38 of the display unit 30 have a rectangular shape or an approximately rectangular shape, and the openings are arranged on two-dimensional xy coordinates such that the longitudinal direction of the openings becomes the y-axis, and the transverse direction thereof becomes the x-axis, the spatial frequency characteristics of the BM 34 have peak intensity that is symmetrical or approximately symmetrical.

For example, when the opening (sub-pixel 32g) of the pixel 32 of the BM 34 has a rectangular shape as shown in FIG. 18A, the position of the spectral peak of the BM pattern 38, that is, the peak position of the BM 34 on the frequency coordinates fx and fy, and the peak intensity of the BM 34 become symmetrical with respect to the fx-axis and the fy-axis respectively as shown in FIG. 18B. In the drawing, the peak intensities Pa, Pb, Pc, and Pd of the peak positions Pa, Pb, Pc, and Pd become the same as each other (Pa=Pb=Pc=Pd). Originally, each of the lattice points in FIG. 18B has peak intensity of some sort. However, in the drawing, the peak intensity is described only for the portions need to be explained, and the peak intensity of other portions is not described.

When the peak intensity distribution of BM has bilateral symmetry as described above, as shown in FIG. 18C which is an enlarged view, it is preferable that the positions of the spectral peaks of the wiring mesh pattern 62 (24) of the conductive film 60 (10 and 11) superimposed on the BM pattern 38, that is, the peak positions of the mesh on the frequency coordinates fx and fy, as well as the peak intensities Pα and Pβ are symmetrical with respect to the fx-axis and the fy-axis respectively (bilateral symmetry: Pα=Pβ). Therefore, the wiring mesh pattern 62 is preferably a symmetrical (bilaterally symmetrical) mesh pattern for the following reason. Each of a distance Pa–Pα between the peak position Pa of BM and the peak position Pα of the mesh and a distance Pb–Pβ between the peak position Pb of BM and the peak position Pβ of the mesh represents the frequency of moire; in each frequency of moire, a product of vector intensities of frequency peaks of BM and the mesh represents the intensity of the moire; and both values of the frequencies and intensities of the moires are the same as each other or close to each other. Consequently, it is easy to obtain the evaluation index of moire from these frequencies and intensities of moires, and to determine the wiring mesh pattern 62 in which the obtained evaluation index of moire becomes equal to or less than a predetermined value (−1.75).

In contrast, for example, as shown in FIG. 19A, when the opening (sub-pixel 32g) of the pixel 32 of the BM 34 of the BM pattern 38 is disposed on the two-dimensional xy coordinates in the same manner as described above such that the rectangular shape of the opening inclines with respect to the y-axis by a predetermined angle, the spatial frequency characteristics of the BM 34 have asymmetrical peak intensity.

For example, as shown in FIG. 19A, when the opening (sub-pixel 32g) of the pixel 32 of the BM 34 has a rectangular shape inclining with respect to the y-axis by a predetermined angle, the positions of spectral peaks of the BM pattern 38, that is, the peak positions of the BM 34 on the frequency coordinates fx and fy, as well as the peak intensities thereof are asymmetrical with respect to the fx-axis and the fy-axis respectively as shown in FIG. 19B. In the drawing, the peak intensity Pe of the peak positon Pe is equal to the peak intensity Ph of the peak position Ph (Pe=Ph), and the peak intensity Pf of the peak position Pf is equal to the peak intensity Pg of the peak position Pg (Pf=Pg). However, the peak intensity Pe of the peak position Pe is different from the peak intensity Pf of the peak position Pf in terms of both the position and the intensity (Pe≠Pf). Originally, each of the lattice points in FIG. 19B also has peak intensity of some sort. However, in the drawing, the peak intensity is described only for the portions need to be explained, and the peak intensity of other portions is not described.

When the peak intensity distribution of BM is not bilaterally symmetrical as described above, as shown in FIG. 19C which is an enlarged view, it is preferable that the positions of the spectral peaks of the wiring mesh pattern 62 of the conductive film 60 that is superimposed on the BM pattern 38, in other words, the peak positions of the mesh on the frequency coordinates fx and fy, as well as the peak intensities Pγ and Pδ are also asymmetrical with respect to the fx-axis and the fy-axis respectively (non-bilateral symmetry: Pγ≠Pδ). Consequently, the wiring mesh pattern 62 is preferably an asymmetrical (non-bilaterally symmetrical) mesh pattern for the following reason. Each of a distance Pe–Pγ between the peak position Pe of BM and the peak position Pγ of the mesh and a distance Pf–Pδ between the peak position Pf of BM and the peak position Pδ of the mesh represents the frequency of moire, and in each frequency of moire, a product of vector intensities of the frequency peaks of BM and the mesh represents the intensity of moire. When the peak intensity Pe and the peak intensity Pf of BM are different from each other, for example, when the peak intensity Pf is higher than the peak intensity Pe, the spectral intensity becomes asymmetrical with respect to each of the fx-axis and the fy-axis. As a result, if the peak positions Pγ and Pδ of the mesh are changed, in other words, if the frequency is changed to the frequency fI (Pe–Pγ) of moire on the left side in the drawing and to the frequency fII (Pf–Pδ) of moire on the right side in the drawing, the moire recognition property is improved. That is, if the wiring mesh pattern 62 is made into an asymmetrical pattern such that the peak positions Pγ and Pδ of the mesh are not bilaterally symmetrical, the moire recognition property can be improved.

In this way, in a case in which the openings of BM are not bilaterally symmetrical, and the spatial frequency characteristics of BM have asymmetrical peak intensity, that is, the spectral intensity is not symmetrical with respect to the fx-axis and the fy-axis respectively, if a mesh pattern that is not bilaterally symmetrical is used, the moire recognition property can be improved. Needless to say, even in this case, from the obtained frequencies and intensities of the moires, the evaluation index of moire is obtained, and the wiring mesh pattern 62 in which the obtained evaluation index of moire becomes equal to or less than a predetermined value (−1.75) is determined.

It goes without saying that in the present invention, as long as the evaluation index of moire obtained according to the present invention is equal to or less than a predetermined value (−1.75), the BM pattern 38 may be either a pattern having symmetrical peak intensity distribution or a pattern having asymmetrical peak intensity distribution, and the peak intensity distribution of the wiring pattern 62 of the conductive film 60 that is superimposed on the BM pattern 38 may be symmetrical or asymmetrical and therefore, the pattern shape of the mesh pattern may be symmetrical or asymmetrical.

Hereinafter, the present invention will be specifically described based on examples.

With respect to the BM pattern 38 shown in FIG. 8A and a large number of wiring patterns 62 which had various pattern shapes shown in FIGS. 16A, 16B, 16C, 16D, and 17 (the shape and size of the opening 22 vary between the pattern shapes) and differed from each other in terms of the line width of the thin metal wires 14, the respective wiring patterns 62 were superimposed on the BM pattern 38 in simulation samples and actual samples, and the evaluation indexes of moire were obtained. In addition, three researchers were asked to visually observe moire that occurred due to the interference between the wiring pattern 62 and the BM pattern 38 superimposed on each other so as to perform sensory evaluation.

The results are shown in Tables 1 to 4.

The results of the sensory evaluation were evaluated on a scale of 1 to 6. When anyone of the researchers answered that moire was visually recognized and irritating, the moire was evaluated to be "irritating", and the example scored 1. When none of the researchers gave 1 to an example, and any one of the researchers answered that moire was visually recognized and slightly irritating, the moire was evaluated to be "slightly irritating", and the example scored 2. When none of the researchers gave 1 or 2 to an example, and two or more researchers answered that moire was practically not irritating, the moire is evaluated to be "practically not irritating", and the example scored 3. When one researcher gave 3 to an example, and two researchers answered that moire was not irritating, the moire was evaluated to be "hardly irritating", and the example scored 4. When one or more researchers answered that moire was not irritating, and all of the other researchers answered that the moire was not irritating at all, the moire was evaluated to be "not irritating", and the example scored 5. When all of the researchers answered that moire was not irritating at all, the moire was evaluated to be "not irritating at all", and the example scored 6.

The present examples were performed under the conditions in which the brightness L of a display was set to be 500 cd, and as the observation distance d, six kinds of observation distances d1 to d6 including 150 mm, 200 mm, 250 mm, 300 mm, 400 mm, and 500 mm were used. Furthermore, the viewing angle $X_0$ (deg) of the display surface of the display at the observation distance d was adjusted depending on the observation distance d such that the evaluation area became 40 mm×40 mm.

Each of the sub-pixels of the BM pattern 38 used in the present examples had a shape of a bent band shown in FIG. 8A. The shape of the sub-pixel 32g of the G filter as illustrated in FIG. 8B was bent by 80° at the center thereof in the longitudinal direction with respect to the horizontal direction. The width of the band was 48 μm, the length thereof was 92 μm in the vertical direction in the drawing, and the shape of a single pixel (pixel pitch PH×PV) was 168 μm×168 μm.

Table 1, Table 2, and Table 3 show examples and comparative examples in cases in which the line width of the thin metal wires 14 of the wiring pattern 62 is 2 μm, 4 μm, and 6 μm respectively. Table 4 shows examples in a case in which the line width of the thin metal wires 14 of the wiring pattern 62 is 2 μm, 4 μm, or 6 μm.

Figure 16A:
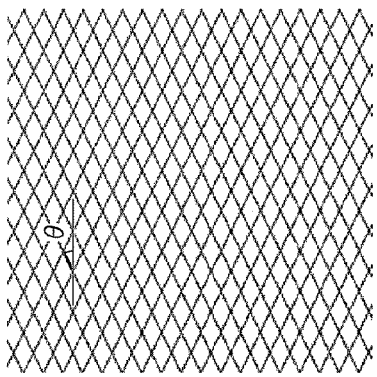
FIGS. 16A, 16B, 16C, and 16D are views schematically illustrating an example of a wiring pattern used in examples.
Figure 16B:
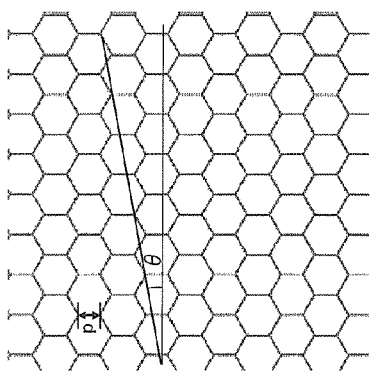
Figure 16C:
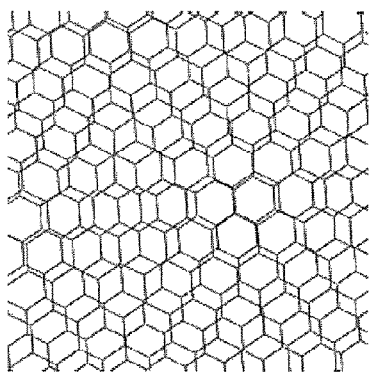
Figure 16D:
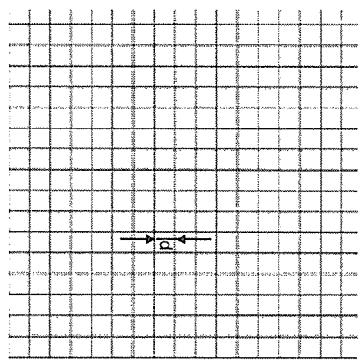
Figure 16E:
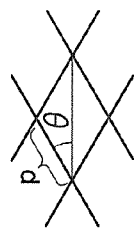
FIGS. 16E, 16F, and 16G are partially enlarged views for illustrating the wiring pattern shown in FIGS. 16A, 16B, and 16D respectively.

Herein, in all the Examples 1 to 10 shown in Table 1, the wiring pattern 62 is a rhombic pattern shown in FIG. 16A in which the line width of the thin metal wires 14 is 2 μm, and the shape of the opening 22 of the wiring pattern 62 corresponds to rhomboids 1 to 10. The wiring patterns 62 in Examples 1 to 10 differ from each other in terms of a parameter represented by p/θ in which p is a length of one side of the rhomboid of the opening 22 enlarged in FIG. 16E, and θ is an angle formed between a long diagonal and one side of the rhomboid.

Except for the line width of the thin metal wires 14, the wiring pattern used in Examples 21 to 30 shown in Table 2 and Examples 41 to 50 shown in Table 3 has the same shape as the wiring pattern 62 used in Examples 1 to 10 shown in Table 1 that has the rhombic pattern including rhomboids 1 to 10.

Figure 16F:
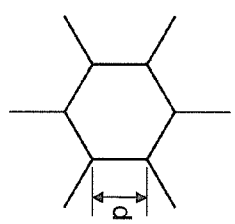

In all the Examples 11 to 15 shown in Table 1, the wiring pattern 62 is a hexagonal pattern shown in one of FIGS. 16B and 16C in which the line width of the thin metal wires 14 is 2 μm, the shape of the opening 22 of the wiring pattern 62 corresponds to regular hexagons 1 to 5, and the wiring pattern 62 is formed of two layers of mesh-like wiring patterns. The wiring patterns 62 in Examples 11 to 15 differ from each other in terms of a parameter represented by p/θ in which p is a length of one side of the regular hexagon of the opening 22 enlarged in FIG. 16F, and θ is a rotation angle of the regular hexagon with respect to a direction (horizontal direction in the drawing) orthogonal to one side in which the regular hexagons are arranged in a line. The parameter p/θ is described for each of the two layers of mesh-like wiring patterns.

In each of Examples 11 and 15, the wiring pattern 62 is used in which the shape of the opening 22 is represented by hexagon 1 and 5 respectively, the openings in both the two layers of mesh-like wiring patterns have the same hexagonal shape, the same size, and the same rotation angle as shown in FIG. 16B, and the two layers of mesh-like wiring patterns are perfectly superimposed on each other without deviating from each other. In Example 12, the wiring pattern 62 is used in which the shape of the opening 22 is represented by hexagon 2, and the openings of the two layers of mesh-like wiring patterns have the same hexagonal shape and the same rotation angle θ26° as shown in FIG. 16C but have different sizes. That is, the length p of one side of the opening is 148 μm or 124 μm. In Examples 13 and 14, the wiring pattern 62 has the openings 22 with a shape corresponding to hexagon 3 and 4 respectively. Similarly to FIG. 16C, in the wiring pattern 62, the openings of the two layers of mesh-like wiring patterns have the same hexagonal shape, but have different rotation angles θ and sizes. That is, the length p of one side thereof varies between the openings.

Except for the line width of the thin metal wires 14, the wiring pattern used in Examples 31 and Comparative examples 1 to 4 shown in Table 2 and in Example 51 and Comparative examples 11 to 14 shown in Table 3 has the same shape as the wiring pattern 62 used in Examples 11 to 15 shown in Table 1 that has the regular hexagonal pattern including hexagons 1 to 5.

Figure 16G:
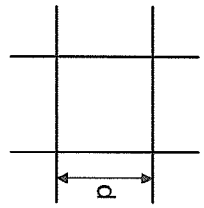

In all the Examples 16 to 20 shown in Table 1, the wiring pattern 62 is a square lattice pattern shown in FIG. 16D in which the line width of the thin metal wires 14 is 2 μm, and the shape of the opening 22 of the wiring pattern 62 corresponds to square lattices 1 to 5 which are squares. The wiring patterns 62 in Examples 16 to 20 differ from each other in terms of a parameter represented by p which is a length of one side of the square lattice of the opening 22 enlarged in FIG. 16G.

Except for the line width of the thin metal wires 14, the wiring pattern used in Comparative examples 5 to 9 shown in Table 2 and Comparative examples 15 to 19 shown in Table 3 has the same shape as the wiring pattern 62 used in Examples 16 to 20 shown in Table 1 that has the square lattice pattern having square lattices 1 to 5.

In all the Examples 61 to 63 shown in Table 4, the wiring pattern 62 is a parallelogrammic pattern shown in FIG. 17 in which the line width of the thin metal wires 14 is 2 μm, 4 μm, or 6 μm, and the shape of the opening 22 of the wiring pattern 62 corresponds to asymmetrical shapes 1 to 3. The wiring patterns 62 used in Examples 61 to 63 differ from each other in terms of a parameter represented by p2/θ2/p1/θ1 in which p1 is a length of a long side of the parallelogram of the opening 22 shown in FIG. 17, θ1 is an angle formed between the long side and the y-axis, p2 is a length of a short side of the parallelogram, and θ2 is an angle formed between the short side and the y-axis.

TABLE 1

Line width 2 μm

| Example No | Line width | Shape | Parameter | Evaluation index | Result of sensory evaluation |
|---|---|---|---|---|---|
| Example 1 | 2 | Rhomboid 1 | 124[μm]/26[deg] | −2.80 | 6 |
| Example 2 | 2 | Rhomboid 2 | 136[μm]/26[deg] | −2.75 | 6 |
| Example 3 | 2 | Rhomboid 3 | 148[μm]/26[deg] | −2.16 | 5 |
| Example 4 | 2 | Rhomboid 4 | 160[μm]/26[deg] | −2.32 | 6 |
| Example 5 | 2 | Rhomboid 5 | 120[μm]/27[deg] | −2.70 | 6 |
| Example 6 | 2 | Rhomboid 6 | 128[μm]/27[deg] | −2.51 | 6 |
| Example 7 | 2 | Rhomboid 7 | 156[μm]/27[deg] | −2.19 | 5 |
| Example 8 | 2 | Rhomboid 8 | 120[μm]/28[deg] | −2.93 | 6 |
| Example 9 | 2 | Rhomboid 9 | 132[μm]/28[deg] | −2.29 | 6 |
| Example 10 | 2 | Rhomboid 10 | 136[μm]/28[deg] | −2.10 | 5 |
| Example 11 | 2 | Hexagon 1 | 124[μm]/0[deg], 124[μm]/0[deg] | −2.25 | 5 |
| Example 12 | 2 | Hexagon 2 | 148[μm]/26[deg], 124[μm]/26[deg] | −1.79 | 3 |
| Example 13 | 2 | Hexagon 3 | 156[μm]/27[deg], 120[μm]/28[deg] | −1.80 | 3 |
| Example 14 | 2 | Hexagon 4 | 136[μm]/28[deg], 160[μm]/26[deg] | −1.77 | 3 |
| Example 15 | 2 | Hexagon 5 | 156[μm]/28[deg], 156[μm]/28[deg] | −2.04 | 4 |
| Example 16 | 2 | Square lattice 1 | 120[μm] | −1.88 | 3 |
| Example 17 | 2 | Square lattice 2 | 124[μm] | −1.87 | 3 |
| Example 18 | 2 | Square lattice 3 | 128[μm] | −1.87 | 3 |
| Example 19 | 2 | Square lattice 4 | 148[μm] | −1.85 | 3 |
| Example 20 | 2 | Square lattice 5 | 160[μm] | −1.86 | 3 |

TABLE 2

Line width 4 μm

| Example No | Line width | Shape | Parameter | Evaluation index | Result of sensory evaluation |
|---|---|---|---|---|---|
| Example 21 | 4 | Rhomboid 1 | 124[μm]/26[deg] | −2.48 | 6 |
| Example 22 | 4 | Rhomboid 2 | 136[μm]/26[deg] | −2.45 | 6 |
| Example 23 | 4 | Rhomboid 3 | 148[μm]/26[deg] | −1.89 | 4 |
| Example 24 | 4 | Rhomboid 4 | 160[μm]/26[deg] | −2.08 | 5 |
| Example 25 | 4 | Rhomboid 5 | 120[μm]/27[deg] | −2.49 | 6 |
| Example 26 | 4 | Rhomboid 6 | 128[μm]/27[deg] | −2.28 | 6 |
| Example 27 | 4 | Rhomboid 7 | 156[μm]/27[deg] | −2.05 | 5 |
| Example 28 | 4 | Rhomboid 8 | 120[μm]/28[deg] | −2.67 | 6 |
| Example 29 | 4 | Rhomboid 9 | 132[μm]/28[deg] | −2.09 | 5 |
| Example 30 | 4 | Rhomboid 10 | 136[μm]/28[deg] | −1.90 | 4 |
| Example 31 | 4 | Hexagon 1 | 124[μm]/0[deg], 124[μm]/0[deg] | −1.91 | 4 |

TABLE 2-continued

Line width 4 μm

| Example No | Line width | Shape | Parameter | Evaluation index | Result of sensory evaluation |
|---|---|---|---|---|---|
| Comparative example 1 | 4 | Hexagon 2 | 148[μm]/26[deg], 124[μm]/26[deg] | −1.56 | 2 |
| Comparative example 2 | 4 | Hexagon 3 | 156[μm]/27[deg], 120[μm]/28[deg] | −1.52 | 1 |
| Comparative example 3 | 4 | Hexagon 4 | 136[μm]/28[deg], 160[μm]/26[deg] | −1.51 | 1 |
| Comparative example 4 | 4 | Hexagon 5 | 156[μm]/28[deg], 156[μm]/28[deg] | −1.74 | 2 |
| Comparative example 5 | 4 | Square lattice 1 | 120[μm] | −1.64 | 2 |
| Comparative example 6 | 4 | Square lattice 2 | 124[μm] | −1.59 | 2 |
| Comparative example 7 | 4 | Square lattice 3 | 128[μm] | −1.59 | 2 |
| Comparative example 8 | 4 | Square lattice 4 | 148[μm] | −1.56 | 2 |
| Comparative example 9 | 4 | Square lattice 5 | 160[μm] | −1.55 | 2 |

TABLE 3

Line width 6 μm

| Example No | Line width | Shape | Parameter | Evaluation index | Result of sensory evaluation |
|---|---|---|---|---|---|
| Example 41 | 6 | Rhomboid 1 | 124[μm]/26[deg] | −2.39 | 6 |
| Example 42 | 6 | Rhomboid 2 | 136[μm]/26[deg] | −2.31 | 6 |
| Example 43 | 6 | Rhomboid 3 | 148[μm]/26[deg] | −1.76 | 3 |
| Example 44 | 6 | Rhomboid 4 | 160[μm]/26[deg] | −1.96 | 4 |
| Example 45 | 6 | Rhomboid 5 | 120[μm]/27[deg] | −2.34 | 6 |
| Example 46 | 6 | Rhomboid 6 | 128[μm]/27[deg] | −2.10 | 5 |
| Example 47 | 6 | Rhomboid 7 | 156[μm]/27[deg] | −1.84 | 3 |
| Example 48 | 6 | Rhomboid 8 | 120[μm]/28[deg] | −2.52 | 6 |
| Example 49 | 6 | Rhomboid 9 | 132[μm]/28[deg] | −1.94 | 4 |
| Example 50 | 6 | Rhomboid 10 | 136[μm]/28[deg] | −1.75 | 3 |
| Example 51 | 6 | Hexagon 1 | 124[μm]/0[deg], 124[μm]/0[deg] | −1.76 | 3 |
| Comparative example 11 | 6 | Hexagon 2 | 148[μm]/26[deg], 124[μm]/26[deg] | −1.38 | 1 |
| Comparative example 12 | 6 | Hexagon 3 | 156[μm]/27[deg], 120[μm]/28[deg] | −1.38 | 1 |
| Comparative example 13 | 6 | Hexagon 4 | 136[μm]/28[deg], 160[μm]/26[deg] | −1.37 | 1 |
| Comparative example 14 | 6 | Hexagon 5 | 156[μm]/28[deg], 156[μm]/28[deg] | −1.60 | 2 |
| Comparative example 15 | 6 | Square lattice 1 | 120[μm] | −1.47 | 1 |
| Comparative example 16 | 6 | Square lattice 2 | 124[μm] | −1.44 | 1 |
| Comparative example 17 | 6 | Square lattice 3 | 128[μm] | −1.43 | 1 |
| Comparative example 18 | 6 | Square lattice 4 | 148[μm] | −1.39 | 1 |
| Comparative example 19 | 6 | Square lattice 5 | 160[μm] | −1.39 | 1 |

TABLE 4

| Example No | Line width | Shape | Parameter | Evaluation index | Result of sensory evaluation |
|---|---|---|---|---|---|
| Example 61 | 2 | Asymmetrical shape 1 | 160[μm]/35[deg] × 320[μm]/35[deg] | −2.12 | 5 |
| Example 62 | 4 | Asymmetrical shape 2 | 160[μm]/35[deg] × 320[μm]/35[deg] | −1.99 | 4 |

TABLE 4-continued

| Example No | Line width | Shape | Parameter | Evaluation index | Result of sensory evaluation |
|---|---|---|---|---|---|
| Example 63 | 6 | Asymmetrical shape 3 | 160[μm]/35[deg] × 320[μm]/35[deg] | −1.81 | 3 |

From Tables 1 to 4, it is understood that regardless of the type of the BM pattern; regardless of whether the peak intensity distribution of the BM pattern is symmetrical or asymmetrical; regardless of the type of the wiring pattern, that is, regardless of the line width of the thin metal wires, the shape or size (pitch or angle) of the opening, the phase angle (rotation angle or deviation angle) of the wiring pattern of two conductive layers, and the like; and regardless of whether the pattern shape of the wiring pattern is symmetrical or asymmetrical, as long as the evaluation index of moire is equal to or less than −1.75 expressed in terms of the common logarithm, even if the moire that occurs due to the interference between the wiring pattern and the BM pattern superimposed on each other is visually recognized, the moire recognition property is equal to or higher than a level at which the moire is practically not irritating. Furthermore, it is understood that as long as the evaluation index of moire is equal to or less than −1.89 expressed in terms of the common logarithm, even if the moire is visually recognized, the moire recognition property is equal to or higher than a level at which the moire is hardly irritating. Moreover, it is understood that as long as the evaluation index of moire is equal to or less than −2.05 expressed in terms of the common logarithm, the moire recognition property is equal to or higher than a level at which the moire is not irritating. In addition, it is understood that as long as the evaluation index of moire is equal to or less than −2.28 expressed in terms of the common logarithm, the moire recognition property is at a level at which the moire is not irritating at all.

As described above, the conductive film of the present invention having a wiring pattern in which the evaluation index of moire satisfies the aforementioned range makes it possible to inhibit the occurrence of moire regardless of the observation distance even if the resolution of a display varies and to greatly improve the visibility.

The above results clearly show the effects of the present invention.

As described in the aforementioned examples, in the present invention, it is possible to prepare in advance wiring patterns having various pattern shapes and to determine a conductive film having an optimized wiring pattern by the evaluation method of the present invention. However, when the evaluation index of moire of one wiring pattern is less than a predetermined value, it is also possible to determine a conductive film having an optimized wiring pattern by repeating a process in which the transmittance image data of the wiring pattern is updated into transmittance image data of a new wiring pattern, and an evaluation index of moire is determined by using the aforementioned evaluation method of the present invention.

Herein, the new wiring pattern to be updated may be prepared in advance or newly created. When the wiring pattern is newly created, one or more among the rotation angle, the pitch, and the pattern width of the transmittance image data of the wiring pattern may be changed, or the shape or the size of the opening of the wiring pattern may be changed. Moreover, randomness may be given thereto.

Hitherto, a conductive film according to the present invention, a display device provided with the conductive film of the present invention, and a method for evaluating a conductive film of the present invention have been described with reference to various embodiments and examples. However, the present invention is not limited to the aforementioned embodiments and examples. Needless to say, the present invention may be improved in various ways, or the design thereof may be changed, as long as the improvement and change do not depart from the gist of the present invention.

What is claimed is:

1. A conductive film installed on a display unit of a display device, comprising:
    a transparent substrate; and
    a conductive portion which is formed on at least one surface of the transparent substrate and is composed of a plurality of thin metal wires,
    wherein the conductive portion has a wiring pattern which is formed of the plurality of thin metal wires in a form of a mesh and in which a plurality of openings are arranged,
    wherein the wiring pattern is superimposed on a pixel array pattern of the display unit, and
    wherein when the wiring pattern is observed from at least one visual point, with respect to frequencies and intensities of moires which are calculated respectively from peak frequencies and peak intensities of a plurality of spectral peaks of two-dimensional Fourier spectra of transmittance image data of the wiring pattern and peak frequencies and peak intensities of a plurality of spectral peaks of two-dimensional Fourier spectra of transmittance image data of the pixel array pattern, an evaluation index of moire, which is calculated from evaluation values of moires obtained by performing weighting on the frequencies and intensities of moires that are equal to or lower than the maximum frequency of moire specified according to display resolution of the display unit by convolution integral using a visual transfer function according to an observation distance as the visual response characteristics, is equal to or less than a predetermined value of −1.75 expressed in terms of a common logarithm.

2. The conductive film according to claim 1, wherein the evaluation index is equal to or less than −1.89 expressed in terms of the common logarithm.

3. The conductive film according to claim 1, wherein a display pitch of the display unit is p (μm) and the maximum frequency of the moire is 1,000/(2p).

4. The conductive film according to claim 1, wherein the visual transfer function is a visual sensitivity function S(u) determined by the following Equation, $$S(u) = \frac{5200 e^{-0.0016 u^2 (1+100/L)^{0.08}}}{\sqrt{\left(1 + \frac{144}{X_o^2} + 0.64 u^2\right)\left(\frac{63}{L^{0.83}} + \frac{1}{1 - e^{-0.02 u^2}}\right)}}$$

wherein u represents a spatial frequency (cycle/deg); L represents brightness (cd/mm$^2$); $X_0$ represents a viewing angle (deg) of a display surface of the display unit at the observation distance; and $X_0^2$ represents a solid angle (sr) formed by the display surface at the observation distance.

5. The conductive film according to claim 1, wherein the evaluation index of moire is calculated for a single frequency of the moire by using the worst evaluation value among the plurality of evaluation values of moires having undergone weighting according to the observation distance.

6. The conductive film according to claim 5, wherein the evaluation index of moire is a sum obtained by summing up the worst evaluation values, each of which is selected for the single frequency of the moire, for all of the frequencies of the moires.

7. The conductive film according to claim 1, wherein the frequencies of moires are obtained as a difference between the peak frequencies of the wiring pattern and the peak frequencies of the pixel array pattern, and the intensities of moires are obtained as a product of the peak intensities of the wiring pattern and the peak intensities of the pixel array pattern.

8. The conductive film according to claim 1, wherein moire selected to apply the visual response characteristics has the intensity of moire of equal to or higher than −4 and has a frequency equal to or lower than the maximum frequency.

9. The conductive film according to claim 1, wherein the peak intensity is a sum of intensities in a plurality of pixels in a vicinity of a peak position of each of the plurality of spectral peaks.

10. The conductive film according to claim 9, wherein the peak intensities are a sum of intensities of top 5 pixels ranked high in terms of intensity among 7×7 pixels in a vicinity of the peak position.

11. The conductive film according to claim 1, wherein the peak intensities are standardized by using the transmittance image data of the wiring pattern and the pixel array pattern.

12. The conductive film according to claim 1, wherein the pixel array pattern is a black matrix pattern.

13. The conductive film according to claim 1, wherein when peak intensity distribution of the plurality of spectral peaks of the two-dimensional Fourier spectra of the pixel array pattern is symmetrical, the wiring pattern has a symmetrical pattern shape.

14. The conductive film according to claim 1, wherein when peak intensity distribution of the plurality of spectral peaks of the two-dimensional Fourier spectra of the pixel array pattern is asymmetrical, the wiring pattern has an asymmetrical pattern shape.

15. A display device comprising:
a display unit; and
the conductive film according to claim 1 that is installed on the display unit.

16. A method for evaluating a conductive film that is installed on a display unit of a display device and has a wiring pattern which is formed of a plurality of thin metal wires in a form of a mesh and in which a plurality of openings are arranged, the method comprising steps of:
obtaining transmittance image data of the wiring pattern and transmittance image data of a pixel array pattern of the display unit on which the wiring pattern is superimposed;
calculating peak frequencies and peak intensities of a plurality of spectral peaks of two-dimensional Fourier spectra of the transmittance image data of the wiring pattern and calculating peak frequencies and peak intensities of a plurality of spectral peaks of two-dimensional Fourier spectra of the transmittance image data of the pixel array pattern by performing two-dimensional Fourier transform on the transmittance image data of the wiring pattern and the transmittance image data of the pixel array pattern;
calculating frequencies and intensities of moires from the peak frequencies and peak intensities of the wiring pattern calculated as above and the peak frequencies and peak intensities of the pixel array pattern calculated as above;
selecting moire having a frequency equal to or lower than the maximum frequency of moire specified according to display resolution of the display unit, from among the moires having the frequencies and the intensities calculated as above;
obtaining evaluation values of moires by performing weighting on the frequencies and intensities of moires at the frequencies of the respective moires selected as above by convolution integral using a visual transfer function according to an observation distance as the visual response characteristics;
calculating an evaluation index of moire from a plurality of the evaluation values of moires obtained as above; and
evaluating a conductive film in which the evaluation index of moire calculated as above is equal to or less than a predetermined value of −1.75 expressed in terms of a common logarithm.

* * * * *